(12) United States Patent
Mushtaq et al.

(10) Patent No.: US 7,588,828 B2
(45) Date of Patent: Sep. 15, 2009

(54) PREPARATION OF NANOPARTICLE MATERIALS

(75) Inventors: Imrana Mushtaq, Manchester (GB); Steven Daniels, Manchester (GB); Nigel Pickett, East Croyden (GB)

(73) Assignee: Nanoco Technologies Limited, Manchester (GB)

( * ) Notice: Subject to any disclaimer, the term of this patent is extended or adjusted under 35 U.S.C. 154(b) by 0 days.

(21) Appl. No.: 11/852,748

(22) Filed: Sep. 10, 2007

(65) Prior Publication Data
US 2008/0160306 A1 Jul. 3, 2008

Related U.S. Application Data

(63) Continuation-in-part of application No. 11/579,050, filed on Oct. 27, 2006.

(30) Foreign Application Priority Data

Apr. 30, 2004 (GB) ............................. 0409877.8
Apr. 27, 2005 (GB) ............... PCT/GB2005/001611

(51) Int. Cl.
B32B 5/66 (2006.01)
(52) U.S. Cl. ................... 428/403; 428/404; 428/405; 428/406; 427/212
(58) Field of Classification Search ............... 428/403, 428/404, 405, 406; 427/212
See application file for complete search history.

(56) References Cited

U.S. PATENT DOCUMENTS

| 4,609,689 | A | 9/1986 | Schwartz et al. | |
|---|---|---|---|---|
| 6,114,038 | A | 9/2000 | Castro et al. | |
| 6,207,229 | B1 * | 3/2001 | Bawendi et al. | 427/215 |
| 6,322,901 | B1 * | 11/2001 | Bawendi et al. | 428/548 |
| 6,379,635 | B2 | 4/2002 | O'Brien et al. | |
| 6,660,379 | B1 * | 12/2003 | Lakowicz et al. | 428/402 |
| 2003/0017264 | A1 | 1/2003 | Treadway et al. | |
| 2003/0106488 | A1 | 6/2003 | Huang et al. | |
| 2004/0110347 | A1 | 6/2004 | Yamashita | |
| 2007/0104865 | A1 | 5/2007 | Pickett | |
| 2007/0202333 | A1 | 8/2007 | O'Brien et al. | |
| 2007/0238126 | A1 | 10/2007 | Pickett et al. | |
| 2008/0220593 | A1 | 9/2008 | Pickett et al. | |
| 2008/0257201 | A1 | 10/2008 | Harris et al. | |
| 2008/0264479 | A1 | 10/2008 | Harris et al. | |

FOREIGN PATENT DOCUMENTS

| CN | 1394599 | 2/2003 |
|---|---|---|
| GB | 9518910.6 | 9/1995 |
| JP | 2005/139389 | 6/2005 |
| WO | WO 97/10175 | 3/1997 |
| WO | WO-00/17642 | 3/2000 |
| WO | WO-02/04527 | 1/2002 |
| WO | WO 02/29140 | 4/2002 |
| WO | WO 03/099708 | 4/2003 |
| WO | WO-2004/066361 | 8/2004 |
| WO | WO-2005/021150 | 3/2005 |
| WO | WO 2004/033366 | 11/2005 |
| WO | WO 2005/106082 | 11/2005 |
| WO | WO-2006/017125 | 2/2006 |
| WO | WO-2006/116337 | 11/2006 |
| WO | WO-2007/049052 | 5/2007 |
| WO | WO-2007/060591 | 5/2007 |
| WO | WO-2007/065039 | 6/2007 |

OTHER PUBLICATIONS

Cumberland et al., "Inorganic clusters as sinle source precursors for preparation of . . . nanomaterials" Chem. Mater. 14, 1576-1584.*
Agger, J.R. et al., *J. Phys. Chem. B* (1998) 102, p. 3345.
Aldana, J. et al., *J. Am. Chem. Soc.* (2001), 123: 8844.
Alivisatos, A.P., *J. Phys. Chem.*, (1996), 100, p. 13226.
Alivisatos, A.P., *J. Am. Chem. Soc.*, (1998) 120, p. 5343.
Bawendi, M.G., *Annu. Rev. Phys. Chem.* (1990), 42: 477.
Berry, C.R., *Phys. Rev.* (1967) 161:848.
Bunge, S.D. et al., *J. Mater. Chem.* (2003) 13: 1705.
Cumberland et al., "Inorganic Clusters as Single-Source Precursors for Preparation of CdSe, ZnSe, and CdSe/ZnS Nanomaterials" *Chemistry of Materials*, 14, pp. 1576-1584, (2002).
Eychmüller, A. et al., *Chem. Phys. Lett.* 208, p. 59. (1993).
Fendler, J.H. et al., *Adv. Mater.* (1995) 7: 607.
Gao, M. et al., *J. Chem. Soc. Commun.* (1994) 2779.
Guzelian, A. et al., *Appl. Phys. Lett.* (1996) 69: 1432.
Guzelian, A. et al., *J. Phys. Chem.* (1996) 100: 7212.
Hagfeldt, A. et al., *Chem. Rev.* (1995) 95: 49.
Henglein, A., *Chem Rev.* (1989) 89: 1861.
Jegier, J.A. et al., *Chem. Mater.* (1998) 10.
Kher, S. et al., *Chem. Mater.* (1994) 6: 2056.
Lieber, C. et al., *Angew. Chem. Int. Ed. Engl.* (1996) 35: 687.
Løver, T. et al., *J. Mater. Chem.* (1997) 7(4): 647.
Matijevic, E., *Ann. Rev. Mater. Sci.* (1985) 15: 483.
Matijevic, E., *Langmuir* (1986) 2:12.
Mekis, I. et al., *J. Phys. Chem. B.* (2003) 107: 7454.
Mićić et al., "Synthesis and Characterization of InP, GaP, and GaInP$_2$ Quantum Dots", *J. Phys. Chem.* (1995) pp. 7754-7759.
Murray, C.B. et al., "Synthesis and characterization of nearly monodisperse CdE (E = sulfur, selenium, tellurium) semiconductor nanocrystallites", *J. Am. Chem. Soc.* (1993) 115 (19) pp. 8706-8715.
Olshavsky, M.A., et al., *J. Am. Chem. Soc.* (1990) 112: 9438.
Peng et al., "Shape control of CdSe nanocrystals", *Nature*, (2000) vol. 404, No. 6773, pp. 59-61.
Pradhan, N. et al., *J. Am. Chem. Soc.* (2003) 125: 2050.
Qu, L. et al., *Nano Lett.* (2001)1: 333.
Salata, O.V. et al., *Appl. Phys. Letters* (1994) 65: 189.
Sercel, P.C. et al., *Appl. Phys. Letters* (1992) 61: 696.

(Continued)

Primary Examiner—Leszek Kiliman
(74) Attorney, Agent, or Firm—Goodwin Procter LLP (57) ABSTRACT

Nanoparticles including a molecular cluster compound incorporating ions from groups 12 and 16 of the periodic table, as well as a core semiconductor material incorporating ions from groups 13 and 15 of the periodic table, are fabricated. The core semiconductor material is provided on the molecular cluster compound.

14 Claims, 4 Drawing Sheets

OTHER PUBLICATIONS

Steigerwald, M.L. et al., *Acc. Chem. Res.* (1990) 23: 183.
Stroscio, J.A. et al., *Science* (1991), 254: 1319.
Trinidade et al., "A single source approach to the synthesis of CdSe nanocrystallites", *Advanced Materials*, vol. 8, No. 2, pp. 161-163. (1996).
Wang Y. et al., *J. Chem. Phys.* (1987) 87:7315.
Weller, H., *Adv. Mater.* (1993) 5:88.
Weller, H., *Angew. Chem. Int. Ed. Engl.* (1993) 32: 41.
Wells, R.L. et al., *Chem. Mater.* (1995) 7:793.
International Search Report for PCT/GB2005/001611 mailed Sep. 8, 2005 (5 pages).
Patents Act 1977: Search Report under Section 17 for Application No. GB0409877.8 dated Oct. 7, 2004 (1 page).
Patent Act 1977 Search Report under Section 17 for Application No. GB0522027.2 dated Jan. 27, 2006 (1 page).
Arici et al., Thin Solid Films 451-452 (2004) 612-618.
Battaglia et al., "Colloidal Two-dimensional Systems: CdSe Quantum Shells and Wells," Angew Chem. (2003) 115:5189.
Castro et al., Chem. Mater. (2003) 15:3142-3147.
Chun et al., Thin Solid Films 480-481 (2005) 46-49.
Contreras et al., "ZnO/ZnS(O,OH)/Cu(In,Ga)Se$_2$/Mo Solar Cell with 18:6% Efficiency," from 3d World Conf. on Photovol. Energy Conv., Late News Paper, (2003) pp. 570-573.
Castro et al., "Synthesis and Characterization of Colloidal CuInS$_2$ Nanoparticles from a Molecular Single-Source Precursors," J. Phys. Chem. B (2004) 108:12429.
Cui et al., "Harvest of near infrared light in PbSe nanocrystal-polymer hybrid photovoltaic cells," Appl. Physics Lett. 88 (2006) 183111-183111-3.
Dance et al., J. Am. Chem. Soc. (1984) 106:6285.
Daniels et al., "New Zinc and Cadmium Chalcogenide Structured Nanoparticles," Mat. Res. Soc. Symp. Proc. 789 (2004).
Gou et al., J. Am. Chem. Soc. (2006) 128:7222-7229.
Gur et al., "Air stable all-inorganic nanocrystal solar cells processed from solution," Lawrence Berkeley Natl. Lab., Univ. of California, paper LBNL-58424 (2005).
Gurin, Colloids Surf. A (1998) 142:35-40.
Hirpo et al., "Synthesis of Mixed Copper-Indium Chalcogenolates. Single-Source Precursors for the Photovoltaic Materials CuInQ2 (Q = S, Se)," J. Am. Chem. Soc. (1993) 115:1597.
Hu et al., Sol. State Comm. (2002) 121:493-496.
Jiang et al., Inorg. Chem. (2000) 39:2964-2965.
Kaelin et al., "CIS and CIGS layers from selenized nanoparticle precursors," Thin Solid Films 431-432 (2003) pp. 58-62.
Kapur et al., "Non-Vacuum processing of CuIn$_{1-x}$Ga$_x$Se$_2$ solar cells on rigid and flexible substrates using nanoparticle precursor inks," Thin Solid Films 431-432 (2003) pp. 53-57.
Kim et al., J. Mech. Sci. Tech. (2005) 19:2085-2090.
Law et al., "Nanowire dye-sensitized solar cells," Nature Mater. (2005) vol. 4 pp. 455-459.
Li et al., Adv. Mat. (1999) 11:1456-1459.
Little et al., "Formation of Quantum-dot quantum-well heteronanostructures with large lattice mismatch: Zn/CdS/ZnS," 114 J. Chem. Phys. 4 (2001).
Lu et al., Inorg. Chem. (2000) 39:1606-1607.
Malik et al., Adv. Mat., (1999) 11:1441-1444.
Mews et al., J. Phys. Chem. (1994) 98:934.
Milliron et al., "Electroactive Surfactant Designed to Mediate Electron Transfer between CdSe Nanocrystals and Organic Semiconductors," Adv. Materials (2003) 15, No. 1, pp. 58-61.
Nairn et al., Nano Letters (2006) 6:1218-1223.
Nazeeruddin et al., "Engineering of Efficient Panchromatic Sensitizers for Nanocrystalline TiO$_2$-Based Solar Cells," J. Am. Chem. Soc. (2001) 123:1613-1624.
Nazeeruddin et al., "Conversion of Light to Electricity by cis-X2Bis(2,2'bipyridyl-4,4'-dicarboxylate)ruthenium(II) Charge-Transfer Sensitizers (X= Cl-, Br-, I-, CN-, and SCN-) on Nanocrystalline TiO$_2$ Electrodes," J. Am. Chem. Soc. (1993) 115:6382-6390.
O'Brien et al., "The Growth of Indium Selenide Thin Films from a Novel Asymmetric Dialkydiselenocarbamate," 3 Chem. Vap. Depos. 4, pp. 227 (1979).
Olson et al., J. Phys. Chem. C. (2007) 111:16640-16645.
Peng et al., J. Am. Chem. Soc. (2001) 123:1389.
Peng et al., "Kinetics of I-VI and III-V Colloidal Semiconductor Nanocrystal Growth: "Focusing" os Size Distributions", J. Am. Chem. Soc., (1998) 129: 5343-5344.
Qi et al., "Efficient polymer-nanocrystal quantum-dot photodetectors," Appl. Physics Lett. 86 (2005) 093103-093103-3.
Robel et al., "Quantum Dot Solar Cells. Harvesting Light Energy with CdSe Nanocrystals Molecularly Linked to Mesoscopic TiO$_2$ Films," J. Am. Chem. Soc. (2006) 128: 2385-2393.
Shulz et al., J. Elect. Mat. (1998) 27:433-437.
Vayssieres et al., "Highly Ordered SnO$_2$ Nanorod Arrays from Controlled Aqueous Growth," Angew. Chem. Int. Ed. (2004) 43: 3666-3670.
Xiao et al., J. Mater. Chem. (2001) 11:1417-1420.
Yang et al., Crystal Growth & Design (2007) 12:2562-2567.
Yu et al., "Polymer Photovoltaic Cells: Enhanced Efficiencies via a Network of Internal Donor-Acceptor Heterojunctions," 270 Science 5243 (1995), pp. 1789-1791.
Zhong et al., Nanotechnology 18 (2007) 025602.
Patent Act 1977 Search Report under Section 17 for Application No. GB0606845.6.
Patent Act 1977 Search Report under Section 17 for Application No. GB0719073.9.
Patent Act 1977 Search Report under Section 17 for Application No. GB0719075.4.
Patent Act 1977 Search Report under Section 17 for Application No. GB0723539.3.

\* cited by examiner

PREPARATION OF NANOPARTICLE MATERIALS

RELATED APPLICATIONS

The present application is a continuation-in-part of U.S. application Ser. No. 11/579,050, filed on Oct. 27, 2006, which is the U.S. national stage application of International (PCT) Patent Application Serial No. PCT/GB2005/001611, filed Apr. 27, 2005, which claims the benefit of GB Application No. 0409877.8, filed Apr. 30, 2004. The entire disclosure of each of these applications is hereby incorporated by reference.

BACKGROUND

There has been substantial interest in the preparation and characterization of compound semiconductors in the form of particles with dimensions in the order of 2-50 nanometers (nm), often referred to as quantum dots, nanoparticles, or nanocrystals. Interest has arisen mainly due to the size-related electronic properties of these materials that can be exploited in many commercial applications such as optical and electronic devices, biological labeling, solar cells, catalysis, biological imaging, light-emitting diodes, general space lighting, and electroluminescent and photoluminescent displays.

Two fundamental factors, both related to the size of the individual semiconductor nanoparticle, are responsible for their unique properties. The first is the large surface-to-volume ratio: as a particle becomes smaller, the ratio of the number of surface atoms to that in the interior increases. This leads to the surface properties playing an important role in the overall properties of the material. The second factor is the change in the electronic properties of the material with size, e.g., the band gap gradually becomes larger because of quantum confinement effects as the size of the particle decreases. This effect is a consequence of increased carrier confinement giving rise to discrete energy levels similar to those observed in atoms and molecules, rather than the continuous band of the corresponding bulk semiconductor material. Thus, for a semiconductor nanoparticle, because of the physical parameters, the carriers (i.e., electrons and holes) produced by the absorption of electromagnetic radiation (i.e., a photon) with energy greater then the first excitonic transition, are closer together than in the corresponding bulk (or macrocrystalline) material, so that the coulombic interaction cannot be neglected. This leads to a narrow bandwidth emission, which is dependent upon the particle size and composition. Thus, quantum dots have higher kinetic energy than the corresponding macrocrystalline material and, consequently, the first excitonic transition (i.e., the bandgap) increases in energy with decreasing particle diameter.

Among the most studied semiconductor quantum dot materials have been the chalcogenide II-VI materials, namely zinc sulfide (ZnS), zinc selenide (ZnSe), cadmium sulfide (CdS), cadmium selenide (CdSe), cadmium telluride (CdTe). Reproducible quantum dot production methods have been developed from "bottom-up" techniques, whereby particles are prepared atom-by-atom, i.e. from molecules to clusters to particles, using wet chemical procedures. The coordination about the final inorganic surface atoms in any nanoparticle may be incomplete, with highly reactive non-fully coordinated atomic "dangling bonds" on the surface of the particle, which can lead to particle agglomeration. This problem may be overcome by passivating (e.g., capping) the bare surface atoms with protective organic groups.

Figure 1A:
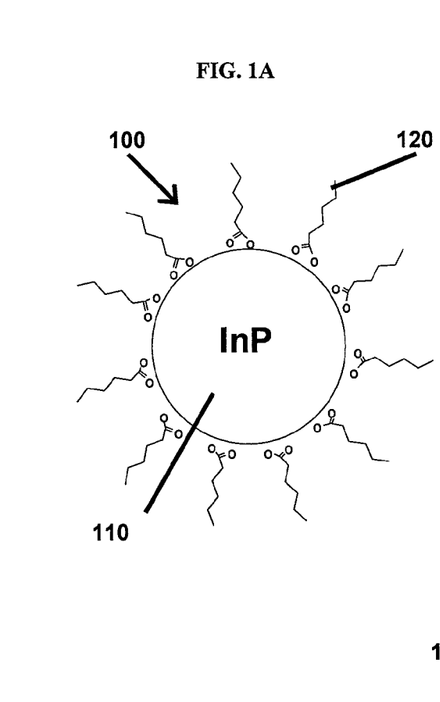
FIGS. 1A-1C schematically depict exemplary single-core, core-shell, and multi-shell nanoparticles.

Single-core semiconductor nanoparticles, which generally consist of a single semiconductor material along with an outer organic passivating layer, tend to have relatively low quantum efficiencies due to non-radiative electron-hole recombination occurring at defects and dangling bonds situated on the nanoparticle surface. FIG. 1A schematically depicts an indium phosphide (InP) single-core nanoparticle 100 with a core 110 including InP and an organic passivation layer 120. The hydrocarbon chains of passivation layer 120 promote monodispersity of a group of nanoparticles in solution.

Figure 1B:
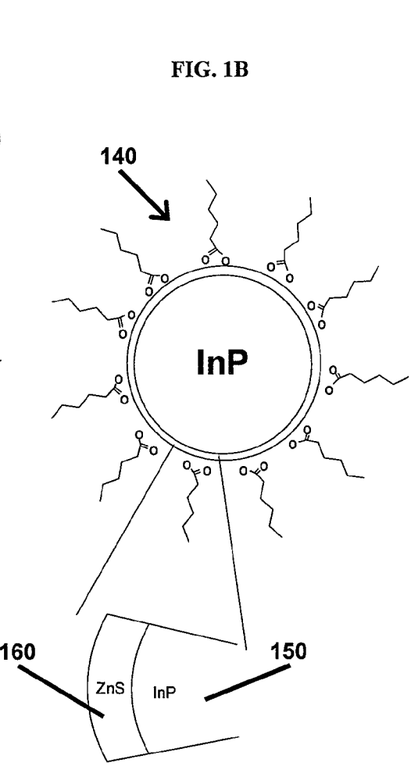

One method to eliminate defects and dangling bonds is growth of a second inorganic material, having a wider bandgap and small lattice mismatch to that of the core material, epitaxially on the surface of the core particle to produce a "core-shell" nanoparticle. Core-shell nanoparticles separate any carriers confined in the core from surface states that would otherwise act as non-radiative recombination centers. Small lattice mismatch between the core and shell materials also minimizes non-radiative recombination. One example of a core-shell nanoparticle is ZnS grown on the surface of CdSe cores. FIG. 1B schematically depicts a core-shell nanoparticle 140 with a core 150 including InP and a shell 160 including ZnS.

Figure 1C:
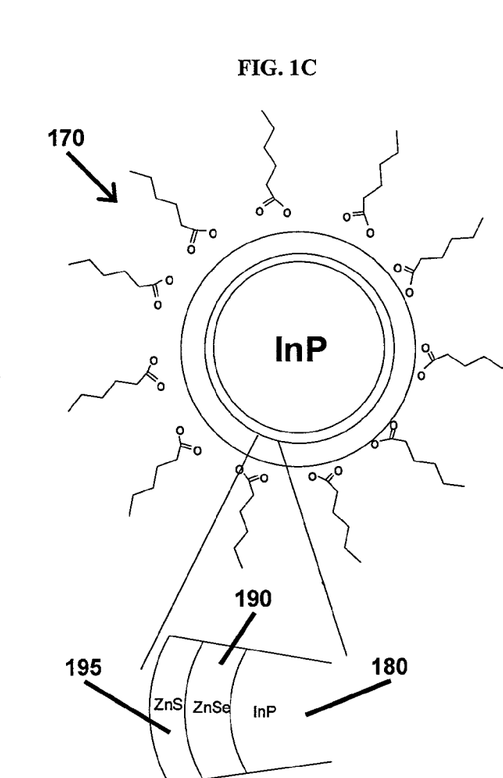
Figure 2:
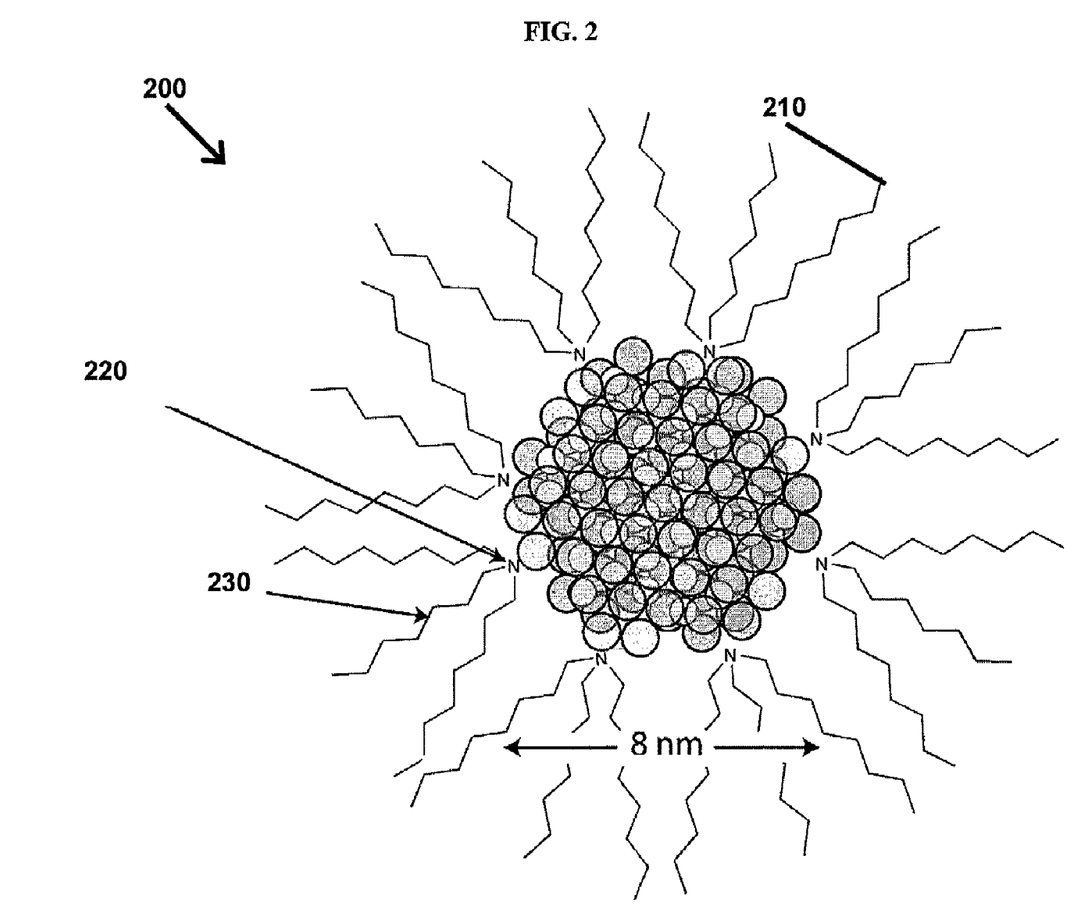
FIG. 2 schematically depicts a nanoparticle coated with a capping layer.

Another approach is the formation of a core-multi shell structure where the electron-hole pair is completely confined to a single shell layer. In these structures, the core is of a wide bandgap material, surrounded by a thin shell of narrower bandgap material, and capped with a further wide bandgap layer, such as CdS/HgS/CdS. In such a structure, a few monolayers of mercury sulfide (HgS) are formed on the surface of the core CdS nanocrystal and then capped by additional CdS. The resulting structures exhibit clear confinement of photoexcited carriers in the narrower bandgap HgS layer. FIG. 1C schematically depicts a multi-shell nanoparticle 170 with a core 180 including InP, a shell 190 including ZnSe, and an outer shell 195 including ZnS. FIG. 2 schematically depicts a nanoparticle 200 coated with a capping layer 210 having a head group 220 (bonded to the nanoparticle) and hydrocarbon chains 230.

The outermost layer of organic material (i.e., the capping agent) or sheath material helps to inhibit particle aggregation, and further protects the nanoparticle from the surrounding chemical environment. It also may provide a means of chemical linkage to other inorganic, organic, or biological material. In many cases, the capping agent is the solvent in which the nanoparticle preparation is undertaken, and consists of a Lewis base compound or a Lewis base compound diluted in a inert solvent such as a hydrocarbon. The capping agent includes a lone pair of electrons that are capable of donor-type coordination to the surface of the nanoparticle, and may include mono- or multi-dentate ligands of the types: phosphines (trioctylphosphine, triphenolphosphine, t-butylphosphine), phosphine oxides (trioctylphosphine oxide), alkyl phosphonic acids, alkyl-amine (hexadecylamine, octylamine), aryl-amines, pyridines, long chain fatty acids, and thiophenes. Other types of materials may also be appropriate capping agents.

The outermost layer (capping agent) of a quantum dot may also consist of a coordinated ligand that processes additional functional groups that can be used as chemical linkage to other inorganic, organic or biological material. In such a case, the functional group may point away from the quantum dot surface and is available to bond/react with other available molecules, such as primary, secondary amines, alcohols, carboxylic acids, azides, or hydroxyl groups. The outermost layer (capping agent) of a quantum dot may also consist of a coordinated ligand, processing a functional group that is polymerizable, which may be used to form a polymer around the particle.

The outermost layer (capping agent) may also consist of organic units that are directly bonded to the outermost inorganic layer, and may also process a functional group, not bonded to the surface of the particle, that may be used to form a polymer around the particle.

Important issues related to the synthesis of high-quality semiconductor nanoparticles are particle uniformity, size distribution, quantum efficiencies, long-term chemical stability, and long-term photostability. Early routes applied conventional colloidal aqueous chemistry, with more recent methods involving the kinetically controlled precipitation of nanocrystallites, using organometallic compounds.

SUMMARY OF THE INVENTION

In accordance with embodiments of the invention, conversion of a precursor composition to nanoparticles is effected in the presence of a molecular cluster compound. Molecules of the cluster compound act as a seed or nucleation point upon which nanoparticle growth may be initiated. In this way, a high-temperature nucleation step is not required to initiate nanoparticle growth because suitable nucleation sites are already provided in the system by the molecular clusters. The molecules of the cluster compound act as a template to direct nanoparticle growth. "Molecular cluster" is a term which is widely understood in the relevant technical field, but for the sake of clarity should be understood herein to relate to clusters of three or more metal atoms and their associated ligands of sufficiently well-defined chemical structure such that all molecules of the cluster compound possess approximately the same relative molecular formula. (When the molecules possess the same relative molecular formula, the molecular clusters are identical to one another in the same way that one $H_2O$ molecule is identical to another $H_2O$ molecule.) The molecular clusters act as nucleation sites and are much better defined than the nucleation sites employed in other methods. The use of a molecular cluster compound may provide a population of nanoparticles that are essentially monodisperse. A significant advantage of this method is that it can be more easily scaled-up to production volumes when compared to other methods of nanoparticle generation. Methods of producing suitable molecular cluster compounds are known within the art, examples of which can be found at the Cambridge Crystallographic Data Centre (www.ccdc.ca.ac.uk).

Accordingly, in a first aspect, the invention features a nanoparticle including a molecular cluster compound incorporating ions from groups 12 and 16 of the periodic table, as well as a core semiconductor material incorporating ions from groups 13 and 15 of the periodic table provided on the molecular cluster compound. The molecular cluster compound and the core semiconductor material may have compatible crystal phases, and the molecular cluster compound may incorporate zinc ions.

Various embodiments of the invention incorporate one or more of the following features. The group 16 ions may include at least one member of the group consisting of oxide ions, sulfide ions, selenide ions, and telluride ions. The group 13 ions may include at least one member of the group consisting of aluminum ions, gallium ions, and indium ions. The group 15 ions may include at least one member of the group consisting of nitride ions, arsenide ions, and antimonide ions. The nanoparticle may exhibit a quantum efficiency ranging from about 20% to about 60%.

In an embodiment, the nanoparticle includes a first layer including a first semiconductor material provided on the nanoparticle core. The first semiconductor material may incorporate ions from group 12 of the periodic table, e.g., zinc ions, and/or from group 16, e.g., at least one member of the group consisting of oxide ions, sulfide ions, selenide ions, and telluride ions. A second layer including a second semiconductor material may be provided on the first layer.

In a second aspect, the invention features a method for producing nanoparticles including the steps of providing a nanoparticle precursor composition including group 13 ions and group 15 ions, and effecting conversion of the nanoparticle precursor into nanoparticles. The conversion is effected in the presence of a molecular cluster compound incorporating group 12 ions and group 16 ions under conditions permitting nanoparticle seeding and growth.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments of the invention involve the large-scale synthesis of III-V quantum dots (nanoparticles) whereby a seeding molecular cluster is placed in a solvent (coordinating or otherwise) in the presence of other precursors to initiate particle growth. Moreover, the seeding molecular cluster is employed as a template to initiate particle growth from other precursors present within the reaction solution. The molecular cluster used as a seed can either consist of the same elements as those required in the subsequent quantum dot or different elements that are not required in the final quantum dots but facilitate the seeding process. In accordance with embodiments of the current invention, the molecular cluster to be used as the seeding agent is either prefabricated or produced in situ prior to acting as a seeding agent. In accordance with embodiments of the invention, some precursors may not be present at the beginning of the reaction process along with the molecular cluster; however, as the reaction proceeds and the temperature is increased, additional amounts of precursors are periodically added to the reaction either drop-wise as a solution or as a solid.

In various embodiments of the invention, the formation of nanoparticles from the precursor(s) is carried out under conditions to ensure that, either there is direct reaction and growth between the precursor composition and the molecular cluster, or some clusters grow at the expense of others (due to Ostwald ripening) until reaching a certain size at which there is direct growth of the nanoparticle from the precursor(s).

Such conditions ensure that the monodispersity of the cluster compound is maintained throughout nanoparticle growth, which in turn ensures that a monodisperse population of nanoparticles is obtained.

Any suitable molar ratio of the molecular cluster compound to, e.g., first and second nanoparticle precursors may be used, and may depend upon the structure, size and composition of the nanoparticles being formed. The desired ratio may also depend upon the nature and concentration of the other reagents, such as the nanoparticle precursor(s), the capping agent, size-directing compounds, and/or solvents. In embodiments utilizing first and second precursors, ratios of the number of moles of the molecular cluster compound to the total number of moles of the first and second precursor species may be in the range 0.0001-0.1 (no. moles of cluster compound):1 (total no. moles of first and second precursor species), 0.001-0.1:1, or 0.001-0.060:1. The ratios of the number of moles of the molecular cluster compound to the total number of moles of the first and second precursor species may lie in the range 0.002-0.030:1, or 0.003-0.020:1. In preferred embodiments, the ratio of the number of moles of the molecular cluster compound to the total number of moles of the first and second precursor species may lie in the range 0.0035-0.0045:1.

Any suitable molar ratio of a first precursor species to a second precursor species may be used. For example, the molar ratio of the first precursor species to the second precursor species may lie in the range 100-1 (first precursor species):1 (second precursor species), or 50-1:1. The molar ratio of the first precursor species to the second precursor species may even lie in the range 40-5:1, or 30-10:1. In various embodiments, approximately equal molar amounts of the first and second precursor species are used. The molar ratio of the first precursor species to the second precursor species may lie in the range 0.1-1.2:1, 0.9-1.1:1, or 1:1. In some embodiments, it is appropriate to use approximately twice the number of moles of one precursor species than that of the other precursor species. Thus, the molar ratio of the first precursor species compared to the second precursor species may lie in the range 0.4-0.6:1, or, in a preferred embodiment, 0.5:1.

Various embodiments of the invention concern the conversion of a nanoparticle precursor composition to a desired nanoparticle. Suitable precursors include single-source precursors which comprise the two or more ions to be incorporated into the growing nanoparticle, or multi-source precursors in which two or more separate precursors each contain at least one ion to be included in the growing nanoparticle. The total amount of precursor composition required to form the final desired yield of nanoparticles may be added before nanoparticle growth has begun; alternatively, the precursor(s) may be added in stages throughout the reaction.

The conversion of the precursor(s) into nanoparticles may be conducted in a suitable solvent. When the cluster compound and nanoparticle precursor(s) are introduced into the solvent, the temperature of the solvent is preferably sufficiently high to ensure satisfactory dissolution and mixing of the cluster compound. Full dissolution is preferable but not necessary. The temperature is preferably low enough to prevent disruption of the integrity of the cluster compound molecules. Exemplary solvent temperatures high enough to promote dissolution of the cluster compound yet low enough to maintain cluster compound integrity may be within the range of approximately 25° C. to approximately 100° C. Once the cluster compound and precursor composition are sufficiently well dissolved in the solvent, the temperature of the solution thus formed is raised to a temperature, or to a range of temperatures, which is/are sufficiently high to initiate nanoparticle growth but not so high as to damage the integrity of the cluster compound molecules. For example, the growth initiation temperature may be within the range of approximately 100° C. to approximately 350° C. As the temperature is increased, further quantities of the precursor may be added to the reaction in a drop-wise manner (i.e., in liquid form) or as a solid. The temperature of the solution may then be maintained at the formation temperature (or within the formation temperature range) for as long as required to form nanoparticles possessing the desired properties.

A wide range of appropriate solvents is available. The choice of solvent used may depend upon the nature of the reacting species, i.e. the nanoparticle precursor and/or cluster compound, and/or the type of nanoparticles which are to be formed. Typical solvents include Lewis base-type coordinating solvents, such as a phosphine (e.g., tri-n-octylphosphine (TOP)), a phosphine oxide (e.g., tri-n-octylphosphine oxide (TOPO)), an amine (e.g., hexadecylamine (HDA)), a thiol such as octanethiol, or a non-coordinating organic solvent, e.g. an alkane or an alkene. If a non-coordinating solvent is used, it will usually be in the presence of an additional coordinating agent to act as a capping agent. The reason is that capping of nanoparticle surface atoms which are not fully coordinated, i.e., have dangling bonds, serves to minimize non-radiative electron-hole recombination and inhibit particle agglomeration (which can lower quantum efficiencies). A number of different coordinating solvents may also act as capping or passivating agents, e.g. TOP, TOPO, organo-thiols, long-chain organic acids such as myristic acid, long chain amines, or functionalized PEG chains. If a solvent is used which does not act as a capping agent, then any desirable capping agent may be added to the reaction mixture during nanoparticle growth. Such capping agents are typically Lewis bases, but a wide range of other agents is available, such as oleic acid or organic polymers which form protective sheaths around the nanoparticles.

In accordance with embodiments of the invention, III-V nanoparticles are produced using molecular clusters, which may be collections of identical molecules (rather than ensembles of small nanoparticles which may lack the anonymous nature of molecular clusters). Molecular clusters can either have the same elements as required in the nanoparticles to be formed, or other elements, as long as they can facilitate a seeding reaction. For example, III-V molecular clusters are notoriously difficult to produce, but many types of II-VI molecular clusters may be produced relatively easily. Moreover, it is possible to use a II-VI molecular cluster, such as $[HNEt_3]_4[Zn_{10}S_4(SPh)_{16}]$, to seed the growth of III-V materials, such as InP and gallium phosphide (GaP) and their alloys, in nanoparticle form. Other molecular compounds, herein referred to as "molecular feedstocks," may be added and consumed to facilitate particle growth. These molecular sources may be periodically added to the reaction solution to keep the concentration of free ions to a minimum but also maintain a concentration of free ions to inhibit Ostwald ripening and defocusing of nanoparticle size range.

Nanoparticle growth may be initiated by heating (thermolysis), or by solvothermal methods. (As used herein, solvothermal refers to heating in a reaction solution so as to initiate and sustain particle growth, and may also be referred to as thermolsolvol, solution-pyrolysis, or lyothermal methods.) Particle preparation may also include changing of the reaction conditions such as adding a base or an acid (i.e., changing the pH of the mixture), pressure change (e.g., using pressures much greater than atmospheric pressure), or utilizing microwave or other electromagnetic radiation.

The progress of nanoparticle growth can be monitored in any convenient way, such as photoluminescence (PL) or UV-visible (UV-vis) spectroscopy. Once nanoparticles have been produced having the desired properties, e.g., when a nanoparticle peak is observed on the PL/UV-vis emission spectra at the desired wavelength, further growth may be inhibited by altering the reaction conditions, e.g. reducing the temperature of the solution below that necessary to support nanoparticle growth. At this stage, the nanoparticles can be isolated from the growth solution by any convenient means, such as precipitation, or allowed to anneal at a suitable temperature for any desirable amount of time, e.g., 10 minutes to 72 hours, to "size-focus" via Ostwald ripening prior to isolation. Following initial isolation, the nanoparticle material may then be subject to one or more rounds of washing to provide final nanoparticles of high purity.

Figure 3:
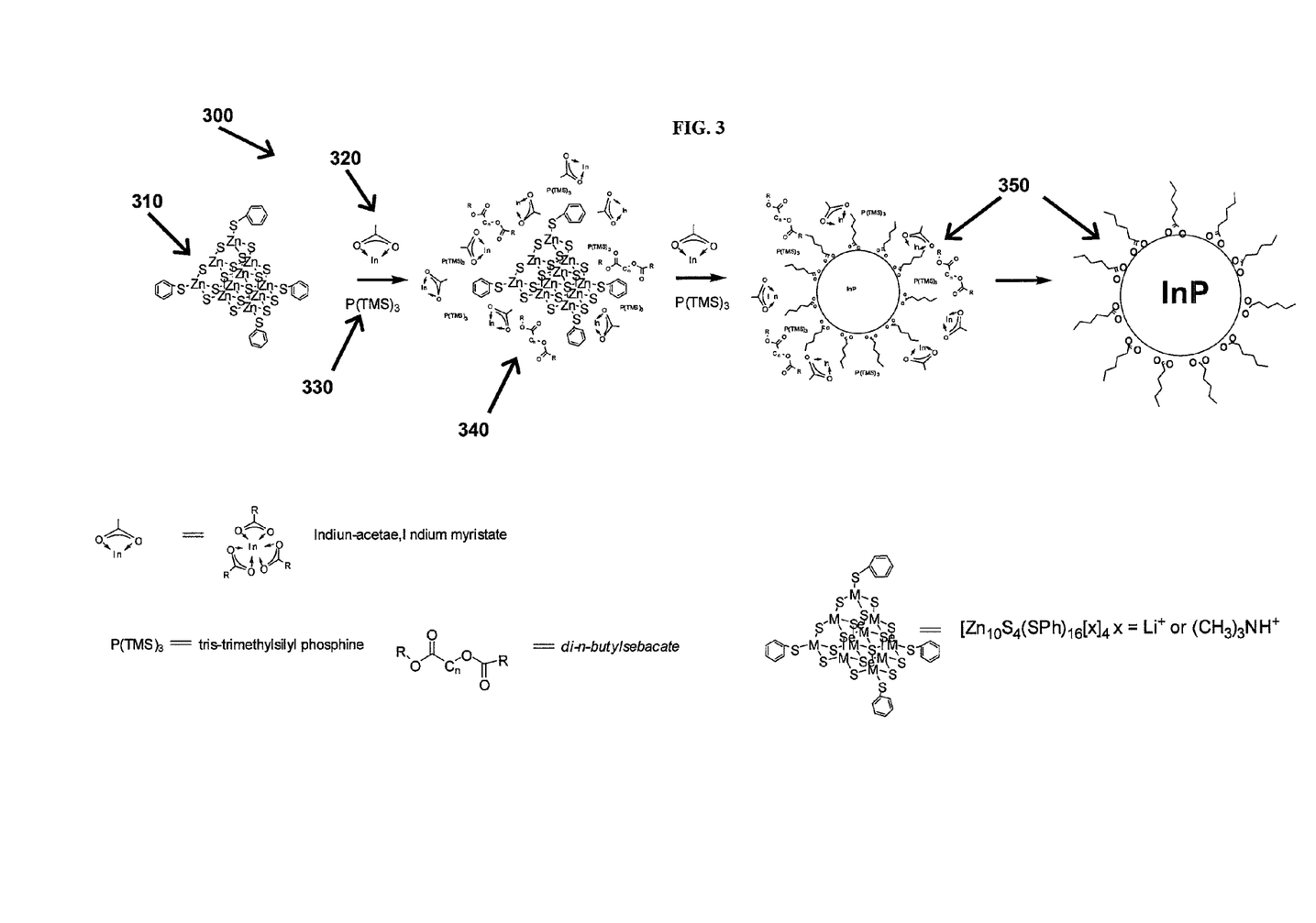
FIG. 3 schematically depicts the formation of a nanoparticle using a molecular seed, capping agent, and precursors.

Referring to FIG. 3, a method 300 for nanoparticle formation is depicted. To molecular seed 310, e.g., $[Zn_{10}S_4(SPh)_{16}][X]_4$ (where X=Li+ or $(CH_3)_3NH^+$) are added precursors 320 and 330. In an exemplary embodiment, precursor 320 is an indium source, and may include indium acetate and/or indium myristate, and precursor 330 is a phosphorous source, and may include tris-trimethylsilyl phosphine ($P(TMS)_3$). Capping agent 340, e.g., di-n-butylsebacate, is also present in the reaction mixture. The indium and phosphorous atoms from precursors 320 and 330 bond to molecular seed 310, resulting the formation of nanoparticle 350 including an InP core.

Conditions for the Preparation of Semiconductor Nanoparticles

Feedstocks: Suitable molecular feedstocks may be in the form of a single-source precursor or a multi-source precursor. These feedstocks may be added at the beginning of the reaction or periodically throughout the reaction of particle growth. The feedstock may be in the form of liquids, solutions, solids, slurries and/or gases.

In-situ formation of seeding cluster: The cluster to be employed as the seeding template may be prefabricated prior to the reaction and added to the reaction solution at the beginning of the reaction process or formed in situ in the reaction solution prior to the addition of precursors used for the growth of the nanoparticles.

Embodiments of the invention may be utilized to prepare semiconductor nanoparticle materials, preferably within the size range 2-100 nm. The core material of the nanoparticle may include:

III-V (i.e., 13-15) material including a first element from group 13 of the periodic table and a second element from group 15 of the periodic table, including but not limited to boron phosphide (BP), aluminum phosphide (AlP), aluminum arsenide (AlAs), aluminum antimonide (AlSb), gallium nitride (GaN), GaP, gallium arsenide (GaAs), gallium antimonide (GaSb), indium nitride (InN), InP, indium arsenide (InAs), indium antimonide (InSb), aluminum nitride (AlN), boron nitride (BN), and/or ternary or quaternary alloys of these materials. The material may be doped with at least one suitable dopant. As utilized herein, references to doping or suitable dopants include addition of elements from adjoining groups of the periodic table, e.g., group II, group IV, and/or group VI elements, or other main-group or rare-earth elements. In certain embodiments, the dopant is a transition metal or rare earth element, e.g., a ZnS nanoparticle may be doped with $Mn^+$ or $Cu^{2+}$.

IIA-VIB (i.e., 2-16) material including a first element from group 2 of the periodic table and a second element from group 16 of the periodic table, including but not limited to magnesium sulfide (MgS), magnesium selenide (MgSe), magnesium telluride (MgTe), calcium sulfide (CaS), calcium selenide (CaSe), calcium telluride (CaTe), strontium sulfide (SrS), strontium selenide (SrSe), strontium telluride (SrTe), barium sulfide (BaS), barium selenide (BaSe), barium telluride (BaTe), and/or ternary or quaternary alloys of these materials. The material may be doped with at least one suitable dopant.

IIB-VIB (i.e., 12-16) material including a first element from group 12 of the periodic table and a second element from group 16 of the periodic table, including but not limited to ZnS, ZnSe, zinc telluride (ZnTe), CdS, CdSe, CdTe, HgS, mercury selenide (HgSe), mercury telluride (HgTe), and/or ternary or quaternary alloys of these materials. The material may be doped with at least one suitable dopant.

II-V (i.e., 12-15) material including a first element from group 12 of the periodic table and a second element from group 15 of the periodic table, including but not limited to zinc phosphide ($Zn_3P_2$), zinc arsenide ($Zn_3As_2$), cadmium phosphide ($Cd_3P_2$), cadmium arsenide ($Cd_3As_2$), cadmium nitride ($Cd_3N_2$), zinc nitride ($Zn_3N_2$), and/or ternary or quaternary alloys of these materials. The material may be doped with at least one suitable dopant.

III-IV (i.e., 13-14) material including a first element from group 13 of the periodic table and a second element from group 14 of the periodic table, including but not limited to boron carbide ($B_4C$), aluminum carbide ($Al_4C_3$), gallium carbide ($Ga_4C$), and/or ternary or quaternary alloys of these materials. The material may be doped with at least one suitable dopant.

III-VI (i.e., 13-16) material, which includes a first element from group 13 of the periodic table and a second element from group 16 of the periodic table, including but not limited aluminum sulfide ($Al_2S_3$), aluminum selenide ($Al_2Se_3$), aluminum telluride ($Al_2Te_3$), gallium sulfide ($Ga_2S_3$), gallium selenide ($Ga_2Se_3$), indium sulfide ($In_2S_3$), indium selenide ($In_2Se_3$), gallium telluride ($Ga_2Te_3$), indium telluride ($In_2Te_3$), and/or ternary or quaternary alloys of these materials. The material may be doped with at least one suitable dopant.

IV-VI (i.e., 14-16) material, which includes a first element from group 14 of the periodic table and a second element from group 16 of the periodic table, including but not limited to lead sulfide (PbS), lead selenide (PbSe), lead telluride (PbTe), tin sulfide (SnS), tin selenide (SnSe), tin telluride (SnTe), and/or ternary or quaternary alloys of these materials. The material may be doped with at least one suitable dopant.

Material including a first element from any transition metal group of the periodic table and a second element from any group of the d-block elements of the periodic table, including but not limited to nickel sulfide (NiS), chromium sulfide (CrS), copper indium sulfide ($CuInS_2$), and/or ternary or quaternary alloys of these materials. The material may be doped with at least one suitable dopant.

Outer inorganic shell(s): The material used on any shell or subsequent numbers of shells grown onto the core III-V nanoparticle preferably has a crystal phase compatible with that of the core. Compatible crystal phases may be the same, e.g., a hexagonal or cubic material formed on a hexagonal or cubic core. Compatible crystal phases may alternatively be different phases, wherein a lattice spacing of the core material is close enough to a lattice spacing of the shell material such that deleterious lattice strain and/or relaxation (and concomitant defect generation) does not occur. In some embodiments, the shell material is closely lattice-matched to (i.e., has approximately the same lattice constant as) the core material. In other embodiments, a buffer layer is formed on the core to ameliorate the effects of lattice mismatch between the core material and a subsequently formed shell material. The material of a buffer layer and/or a shell material formed on the core may include at least one of the following:

IIA-VIB (i.e., 2-16) material, which includes a first element from group 2 of the periodic table and a second element from group 16 of the periodic table, including but not limited to MgS, MgSe, MgTe, CaS, CaSe, CaTe, SrS, SrSe, SrTe, and/or ternary or quaternary alloys of these materials. The material may be doped with at least one suitable dopant.

IIB-VIB (i.e., 12-16) material, which includes a first element from group 12 of the periodic table and a second element from group 16 of the periodic table, including but not limited to ZnS, ZnSe, ZnTe, CdS, CdSe, CdTe, HgS, HgSe, HgTe, and/or ternary or quaternary alloys of these materials. The material may be doped with at least one suitable dopant.

II-V (i.e., 12-15) material, which includes a first element from group 12 of the periodic table and a second element from group 15 of the periodic table, including but not limited to $Zn_3P_2$, $Zn_3As_2$, $Cd_3P_2$, $Cd_3As_2$, $Cd_3N_2$, $Zn_3N_2$, and/or ternary or quaternary alloys of these materials. The material may be doped with at least one suitable dopant.

III-V (i.e., 13-15) material, which includes a first element from group 13 of the periodic table and a second element from group 15 of the periodic table, including but not limited to BP, AlP, AlAs, AlSb; GaN, GaP, GaAs, GaSb; InN, InP, InAs, InSb, AlN, BN, and/or ternary or quaternary alloys of these materials. The material may be doped with at least one suitable dopant.

III-IV (i.e., 13-14) material, which includes a first element from group 13 of the periodic table and a second element from group 14 of the periodic table, including but not limited to $B_4C$, $Al_4C_3$, $Ga_4C$, and/or ternary or quaternary alloys of these materials. The material may be doped with at least one suitable dopant.

III-VI (i.e., 13-16) material, which includes a first element from group 13 of the periodic table and a second element from group 16 of the periodic table, including but not limited to $Al_2S_3$, $Al_2Se_3$, $Al_2Te_3$, $Ga_2S_3$, $Ga_2Se_3$, $In_2S_3$, $In_2Te_3$, and/or ternary or quaternary alloys of these materials. The material may be doped with at least one suitable dopant.

IV-VI (i.e., 14-16) material, which includes a first element from group 14 of the periodic table and a second element from group 16 of the periodic table, including but not limited to PbS, PbSe, PbTe, SnS, SnSe, SnTe, and/or ternary or quaternary alloys of these materials. The material may be doped with at least one suitable dopant.

Nanoparticle shape: The shape of the nanoparticle produced according to embodiments of the present invention may be spherical. In other embodiments, the nanoparticle has the shape of a rod, disk, tetrapod, or star. Control of the shape of the nanoparticle may be achieved in the particle growth process by the addition of a compound that will preferentially bind to a specific lattice plane of the growing particle and subsequently inhibit or slow particle growth in a specific direction. Example of compounds that may be added include phosphonic acids (n-tetradecylphosphonic acid, hexylphosphonic acid, 1-decanesulfonic acid, 12-hydroxydodecanoic acid, or n-octadecylphosphonic acid).

Various embodiments of the present invention are utilized to form a plurality of monodisperse nanoparticles that are substantially pure (i.e., uniform in chemical composition). Each nanoparticle may substantially consist of a III-V material, and may be stabilized from particle aggregation and the surrounding chemical environment by an organic layer. For example, the nanoparticle may be represented by the formula $(ME)_nL_y$, in which M represents a group III element, E represents a group V element, and L represents a coordinating organic layer or capping agent. Each nanoparticle may form on and around a molecular cluster which may have a chemical formula different from that of the nanoparticle core and/or shell(s).

A molecular cluster is utilized as a template to seed the growth of nanoparticles (with compositions (ME)L, where M and E are the two types of ions making up the nanoparticle, e.g., M is a group III ion and E is a group V ion, and L is the capping agent) from precursors including elements other than those in the molecular cluster. A small quantity of a suitable molecular cluster is mixed with a solvent having a relatively high boiling point. This solvent can also act as a capping agent, and may be, e.g., a Lewis base coordination compound such as a phosphine, a phosphine oxide, an organo-thiol, an amine, or an organic acid. The solvent may alternatively be an inert solvent such as an alkane (e.g., octadecence), and may be utilized with the addition of an additional capping agent compound such as oleic acid. As the reaction temperature is increased, suitable source precursors for M and E are periodically added either drop-wise in liquid from or as small quantities of solid powder. Additionally, a source for M and a source for E may be added to the reaction mixture. The M and E precursor source(s) may either be in the form of two separate precursors (one containing M and the other containing E), or as a single-source precursor that contains both M and E within a single molecule.

The nanoparticle material preferably has a crystal phase compatible with that of the molecular cluster. Compatible crystal phases may be the same, e.g., a hexagonal or cubic nanoparticles formed on a hexagonal or cubic molecular cluster. Compatible crystal phases may alternatively be different phases, wherein a lattice spacing of the nanoparticle material is close enough to a lattice spacing of the molecular cluster material such that deleterious lattice strain and/or relaxation (and concomitant defect generation) does not occur. In some embodiments, the nanoparticle material is closely lattice-matched (i.e., has approximately the same lattice constant) to the molecular cluster material.

Other regents which have the ability to control the shape of the nanoparticles may be added to the reaction mixture, e.g., a compound that can preferentially bind to a specific face (i.e., a lattice plane) of the growing nanoparticle and thus inhibit or slow particle growth along that specific direction of the particle. Moreover, other source precursors (including other elemental species and or dopants) may be added to the reaction to produce ternary, quaternary, or doped particles.

After the molecular cluster is mixed with the coordinating compound, the reaction mixture is heated at an approximately steady rate until nanoparticle growth is initiated upon the surfaces of the molecular cluster templates. At an appropriate temperature (e.g., approximately 100° C. to approximately 350° C.), further quantities of M and E precursors may be added to the reaction mixture, e.g, as a batch addition where solid precursors or solutions containing the precursor atoms are added in bulk, or as an addition over a period of time (which may extend up to and include the entire reaction time) of the solution phase precursors. In various embodiments, the nanoparticle nucleation stage is separated from the nanoparticle growth stage, enabling a high degree of control of nanoparticle size. Nanoparticle size may also be controlled by the temperature of the reaction (generally, higher temperatures lead to larger nanoparticles) and concentrations of precursors present in the reaction. The size of the growing nanoparticles may be approximately determined by use of UV and/or PL spectra of the reaction solution either by an in situ optical probe or from aliquots of the reaction solution. After the desired nanoparticle size is obtained, the temperature may be reduced by a specific amount (e.g., by approximately 20° C. to approximately 80° C.) and the mixture left to anneal for a period of time, e.g., in the range of approximately 10 minutes to approximately 72 hours.

In other embodiments, further reaction steps are performed in order to form core-shell and/or core-multi-shell nanoparticles. Preparation of core-shell nanoparticles having the composition ME/NY, where N and Y are the elements of the shell compound formed around the ME core, may be undertaken either before or after nanoparticle isolation, during which the nanoparticles are isolated from the reaction and redissolved in new (i.e., clean) capping agent. This new capping agent may either be the same capping agent compound utilized in the formation reaction or a different capping agent compound. N and Y precursors are added to the reaction mixture, either in the form of two separate precursors (one containing N and the other containing Y), or a single-source precursor that contains both N and Y within a single molecule, thus forming a ME/NY core-shell nanoparticle.

The process may be repeated with the appropriate precursors to form desired core-multi-shell nanoparticles. Additional shells may include elements other than M, E, N, and Y.

Molecular Clusters

Figure 4A:
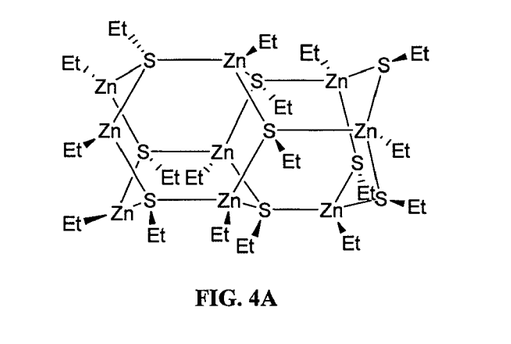
FIGS. 4A-4E schematically depict various exemplary molecular clusters that may be utilized as seeding templates for nanoparticle formation.
Figure 4B:
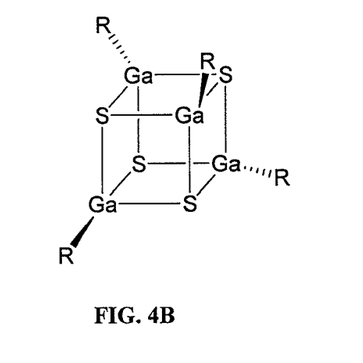
Figure 4C:
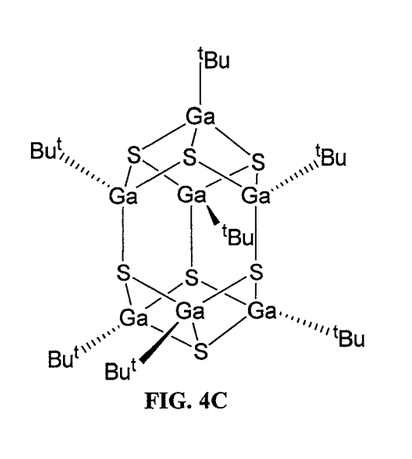
Figure 4D:
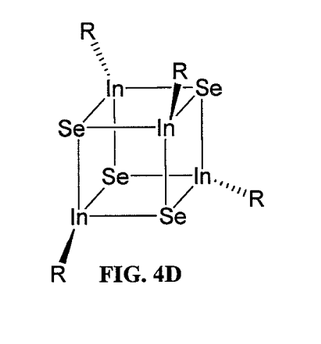
Figure 4E:
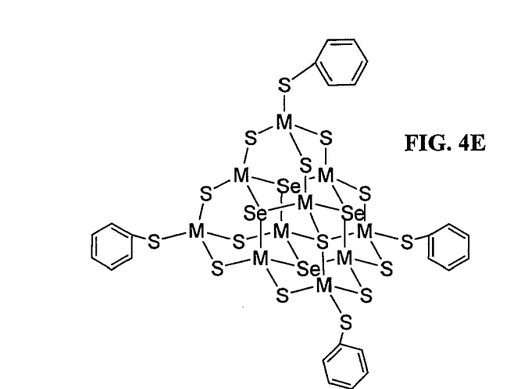

In accordance with embodiments of the invention, molecular clusters are used as templates for the formation of nanoparticles thereon. The molecular clusters may be formed of a plurality of substantially identical molecules. When other precursors are combined with the molecular clusters, the precursors contribute ions which bond to the cluster and form the desired nanoparticle. Hence, the molecular clusters facilitate the nucleation and growth of nanoparticles that may otherwise be quite difficult to fabricate in the absence of the molecular clusters. The choice of molecular clusters may depend on the desired composition of the final nanoparticle, as in the following examples. Exemplary molecular clusters are depicted in FIGS. 4A-4E. FIG. 4A depicts $Zn_{10}(SEt)_{10}Et_{10}$; FIG. 4B depicts $[RGaS]_4$; FIG. 4C depicts $[Bu^tGaS]_7$; FIG. 4D depicts $[RInSe]_4$; and FIG. 3E depicts $[X]_4[M_{10}Se_4(SPh)_{16}]$ (where X=cation, M=Zn, Cd, Te).

The molecular cluster may include substantially all of the elemental species desired in the final nanoparticles. In an embodiment in which a III-V nanoparticle is desired, suitable molecular clusters may include the group III and group V elements desired in the nanoparticle, as well as organic moieties. Examples include but are not limited to:

[EtGaNEt]$_6$;
[MeGaN(4-$C_6H_4F$)]$_6$;
(MeGaNBu)$_6$;
[RAlNR']$_4$ (R=Me, $CH_2Pr^i$, Ph; R'=$Pr^i$, $CH_2Pr^i$, $C_6H_2Me_3$);
[(SiPr$^i_3$)$_3$AsAlH]$_6$;
[$^i$PrNAlH]$_4$;
[RAlNR']$_6$ (R=Me, Et, Cl, $CH_2Ph$, $CH_2Pr^i$, Ph; R'=Me H, Br, C≡CPh, $Pr^i$, $(CH_2)_2Me$, $(CH_2)2NMe_2$, $SiPh_3$);
[$CH_3Ga$—$NCH_2CH(CH_3)_2$]$_6$;
[MeGaN$^i$Bu]$_6$;
[RGaNR']$_4$ (R=Ph, Me; R'=Ph, $C_6F_5$, $SiMe_3$, $^t$Bu);
[EtGaNEt]$_6$;
[RGaPR']$_4$ (R=$^i$Pr, $C_6H_2Me_3$; R'=$^t$Bu, $C_6H_2Me_3$);
[RNInR']$_4$ (R=Cl, Br, I, Me; R'=$^t$Bu, $C_6F_5$, $C_6H_4F$);
[RInPR']$_4$ (R=$^i$Pr, $C_6H_2Me_3$, Et; R'=$SiPh_3$, $C_6H_2Me_3$, Si$^i$Pr$_3$);
[RInPR']$_6$ (R=Et, R'=$SiMe_2(CMe_2{}^iPr)$).

The molecular cluster may include only one of the elemental species (or multiple elemental species from the same periodic table group) desired in the final nanoparticles. In an embodiment in which a III-V nanoparticle is desired, suitable molecular clusters may include either the group III element or the group V element desired in the nanoparticle, as well as organic moieties. Examples include but are not limited to:

II-V-based molecular clusters such as:
[RCdNR']$_4$ (R=Cl, Br, I, $PEt_3$, C≡$CSMe_3$; R'=$PEt_3$, I);
[RCdNR']$_5$ (R=alkyl or aryl group and R'=alkyl or aryl group);
[{RZn}$_6${PR'}$_4$] (R=I, $PEt_2Ph$; R'=$SiMe_3$);
[$M_4Cl_4(PPh_2)_4(P''Pr_3)_2$] (M=Zn, Cd);
[Li(thf)$_4$]$_2$[(Ph$_2$P)$_{10}$Cd$_4$];
[$Zn_4(PPh_2)_4Cl_4(PRR_2')_2$] (PRR'$_2$=PMe''Pr$_2$, P''Bu$_3$, PEt$_2$Ph);
[$Zn_4(P^tBu_2)_4Cl_4$];
or III-VI-based molecular clusters such as:
[($^t$Bu)GaSe]$_4$;
[$^t$BuGaS]$_7$;
[RInSe]$_4$ (R=$^t$Bu, $CMe_2Et$, Si($^t$Bu)$_3$, C((SiMe$_3$)$_3$)$_3$);
[RInS]$_4$ (R=$^t$Bu, $CMe_2Et$);
[RGaS]$_4$ (R=$^t$Bu, $CMe_2Et$, $CEt_3$);
[SAlR']$_4$ (R=C(SMe$_3$)$_3$, $CEtMe_2$);
[SAlNMe$_3$]$_5$;
[TeAlR]$_4$ (R=Cp*, $CEtMe_2$);
[(C(SiMe$_3$)$_3$)GaS]$_4$;
[$^t$BuGaS]$_6$;
[RGaSe]$_4$ (R=$^t$Bu, $CMe_2Et$, $CEt_3$, C(SiMe$_3$)$_3$, Cp*, Bu);
$Cd_4In_{16}S_{33}(H_2O)_{20}(C_{10}H_{28}N_4)_{2.5}$;

The molecular cluster may include substantially none of the elemental species desired in the final nanoparticles. In an embodiment in which a III-V nanoparticle is desired, suitable molecular clusters may include organic moieties but none of the group III and group V elements desired in the nanoparticle. Examples include but are not limited to:

IIB-VIB molecular clusters such as:
[{(PPh$_3$)Hg}$_4$(SPh)$_6$];
(Ph$_4$P)$_2$[(SEt)$_5$(Br)(HgBr)$_4$];
(Ph$_4$P)$_2$[Hg$_4$(SEt)$_5$Br];
[Hg$_4$Te$_{12}$][N(CH$_2$CH$_2$Et)$_4$]$_4$;
IIB-VIB molecular clusters such as:
[RME$^t$Bu]$_5$ (M=Zn, Cd, Hg; E=S, Se, Te; R=Me, Et, Ph);
[X]$_4$[E$_4$M$_{10}$(SR)$_{16}$] (E=S, Se, Te; M=Zn, Cd, Hg; X=Me$_3$NH$^+$, Li$^+$, Et$_3$NH$^+$);
[Cd$_{32}$S$_{14}$(SPh)$_{36}$].L;
[Hg$_{10}$Se$_4$(SePh)(PPh$_2$''Pr)$_4$];
[Hg$_{32}$Se$_{14}$(SePh)$_{36}$];
[Cd$_{10}$Se$_4$(SePh)$_{12}$(PPr$_3$)$_4$];
[Cd$_{32}$Se$_{14}$(SePh)$_{36}$(PPh$_3$)$_4$];
[M$_4$(SPh)$_{12}$]$^+$[X]$_2^-$ (M=Zn, Cd, Hg; X=Me$_4$N$^+$, Li$^+$: [Zn(SEt)Et]$_{10}$);
[MeMEiPr] (M=Zn, Cd, Hg; E=S, Se, Te);
[RCdSR']$_5$ (R=O(ClO$_3$), R'=PPh$_3$, $^i$Pr);
[Cd$_{10}$E$_4$(E'Ph)$_{12}$(PR$_3$)$_4$] (E, E'=Te, Se, S);
[Cd$_8$Se(SePh)$_{12}$Cl$_4$]$^{2-}$);
[M$_4$Te$_{12}$]$^{4-}$ (M=Cd, Hg);
[Ph$_{12}$M$_{18}$Cd$_{10}$(PEt$_3$)$_3$] (M=Te, Se);
or IV-VI molecular clusters such as:
[S$_6${SnR}$_4$] (R=C(SiMe$_3$)$_3$, Me, Ph);
[Se$_6${SnR}$_4$] (R=C$_6$F$_5$, C$_6$H$_2$Me$_3$, p-Tol, C(SiMe$_3$)$_3$).

The molecular cluster may include at least one transition metal and at least one element from the d-block of the periodic table. Examples include but are not limited to:

[Cu$_{12}$Se$_6$(PR$_3$)$_8$] (R=Et$_2$Ph, ''Pr$_3$, Cy$_3$);
[Cu$_{18}$Te$_6$($^t$Bu)$_6$(PPh$_2$Et)$_7$];
[Cu$_{19}$Te$_6$($^t$Bu)$_7$(PEt$_3$)$_8$];

[Cu$_{27}$Te$_{15}$(P$^i$Pr$_2$Me)$_{12}$];
[Ni$_{34}$Se$_{22}$(PPh$_3$)$_{10}$];
[Ag$_{30}$(TePh)$_{12}$Te$_6$(PEt$_3$)$_{12}$];
[Ag$_{30}$Se$_8$(Se$^t$Bu)$_{14}$(PnPr$_3$)$_8$];
[Co4($\mu_3$-Se)$_4$(PPh$_3$)$_4$];
[Co$_6$($\mu_3$-Se)$_8$(PPh$_3$)$_6$];
[W$_3$Se$_4$(dmpe)$_3$Br$_3$]$^+$;
Ru$_4$Bi$_2$(CO)$_{12}$;
Fe$_4$P$_2$(CO)$_{12}$;
Fe$_4$N$_2$(CO)$_{12}$.

Precursors

In accordance with embodiments of the invention, various precursors are utilized as sources for one or more of the elemental species desired in the final nanoparticle. Examples include but are not limited to:

Sources of the group III elements B, Al, Ga, or In:
III-phosphines (i.e., at least one group III element coordinated to a phosphine),
III-(TMS)$_3$,
III-(alkyls) (e.g., trimethyl indium),
III-(aryl),
III-(acetate)$_3$ (e.g., III-(myrisate)$_3$),
mixed alkyl- and aryl-acetates (e.g., III-(myrisate)(acetate)$_2$ or III-(myrisate)$_2$(acetate)),
III-(III) acetylacetonate;
organometallics such as MR$_3$ (M=Ga, In, Al, B; R=alky or aryl group such as Me, Et, $^i$Pr);
coordination compounds such as carbonates, such as M(CH$_3$C)$_3$ (M=B, Al, Ga, In);
β-diketonates or derivatives thereof, such as acetylacetonate (2,4-pentanedionate);
[CH$_3$COOCH=C(O—)CH$_3$]$_2$;
[CH$_3$COOCH=C(O—)CH$_3$]$_2$ (M=B, Al, Ga, In);
inorganic salts such as oxides or nitrides, such as:
In$_2$O$_3$;
Ga$_2$O$_3$;
Al(NO$_3$)$_3$;
In(NO$_3$)$_3$;
Ga(NO$_3$)$_3$;
or elemental B, Al, Ga, and/or In.

Sources of the group V elements N, P, As, Sb, or Bi:
organometallics, in which R=Me, Et, $^t$Bu, $^i$Bu, Pr$^i$, Ph, or similar groups, such as:
NR$_3$, PR$_3$, AsR$_3$, SbR$_3$;
NHR$_2$, PHR$_2$, AsHR$_2$, SbHR$_2$;
NH$_2$R, PH$_2$R, AsH$_2$R$^2$, SbH$_2$R$_3$;
PH$_3$, AsH$_3$;
M(NMe)$_3$ (M=P, Sb, As; dimethyldrazine (Me$_2$NNH$_2$));
ethylazide (Et-NNN);
hydrazine (H$_2$NNH$_2$);
Me$_3$SiN$_3$;
coordination compound such as carbonates, such as MCO$_3$ (M=P) or bismuth subcarbonate ((BiO)$_2$CO$_3$);
β-diketonates or derivatives thereof, such as acetylacetonate (2,4-pentanedionate);
[CH$_3$COOCH=C(O—)CH$_3$]$_3$M (M=Bi);
[CH$_3$COOCH=C(O—)CH$_3$]$_2$M (M=Bi);
inorganic salts such as oxides or nitrates, such as:
P$_2$O$_3$;
As$_2$O$_3$;
Sb$_2$O$_3$;
Sb$_2$O$_4$;
Sb$_2$O$_5$;
Bi$_2$O$_3$;
Bi(NO$_3$)$_3$;
Sn(NO$_3$)$_4$;
Pb(NO$_3$)$_2$;
or elemental N, P, As, Sb, and/or Bi.

Single-source precursors of at least one group III element and at least one group V element (e.g., the precursor molecule includes both M and E for nanoparticle ((M$_a$E$_b$)L$_c$) may include organometallic compounds, inorganic salts, and/or coordination compounds, as in the following examples.
[(Me)$_2$GaN(H)$^t$Bu]$_2$;
[H$_2$GaNH$_2$]$_3$;
[Ph$_2$GaP(SiMe$_3$)$_3$Ga(Ph)$_2$Cl][Et$_2$GaP(SiMe$_3$)$_2$]$_2$,
[Et$_2$GaPEt$_2$]$_3$,
[$^t$Bu$_2$GaPH$_2$]$_3$;
[Me$_2$GaP($^i$Pr)$_2$]$_3$;
[$^t$BuGaPAr']$_2$,
[$^t$Bu$_2$GaP(H)C$_5$H$_9$]$_2$;
Ga(As$^t$Bu$_2$)$_3$ [Et$_2$GaAs(SiMe$_3$)$_2$]$_2$,
[$^t$Bu$_2$GaAs(SiMe$_3$)$_2$]$_2$;
[Et$_2$GaSb(SiMe$_3$)$_2$]$_2$;
[(Me$_3$SiCH$_2$)$_2$InP(SiMe$_3$)$_2$]$_2$;
[R$_2$InP(SiMe$_3$)$_2$]$_2$,
[Me$_2$InP$^t$Bu$_2$]$_2$;
[Me$_2$InSb$^t$Bu$_2$]$_3$;
[Et$_2$InSb(SiMe$_3$)$_2$]$_3$,
[Me$_2$InNEt$_2$]$_2$,
[Et$_2$AlAs$^t$Bu$_2$]$_2$;
[$^t$Bu$_2$AlSb(SiMe$_3$)$_2$]$_2$;
[$^n$Bu$_2$GaAs$^t$Bu$_2$]$_2$;
[Me$_2$Ga$_2$As$^t$Bu$_2$]$_2$;
[Et$_2$GaAs$^t$Bu$_2$]$_2$.

Shell Precursors

In accordance with embodiments of the invention, various precursors are utilized as sources for one or more of the elemental species desired in one or more shells formed around the core of the final nanoparticle. For a shell of composition ME (which includes the elements M and E), a source for element M may be further added to the reaction and may include an M-containing species that has the ability to provide the growing particles with a source of M ions. Likewise, a source for element E may be further added to the reaction and may include an E-containing species that has the ability to provide the growing particles with a source of E ions. The precursor may be an organometallic compound, an inorganic salt, a coordination compound, or an elemental source. Examples of precursor sources for an element M for a II-VI, III-V, III-VI or IV-V shell include but are not limited to:
organometallics such as:
MR$_2$ (M=Mg; R=alky or aryl group (Mg$^t$Bu$_2$));
MR$_2$ (M=Zn, Cd, Te; R=alky or aryl group (Me$_2$Zn, Et$_2$Zn Me$_2$Cd, Et$_2$Cd));
MR$_3$ (M=Ga, In, Al, B; R=alky or aryl group [AlR$_3$, GaR$_3$, InR$_3$ (R=Me, Et, $^i$Pr)]);
coordination compounds such as carbonates:
MCO$_3$ (M=Ca, Sr, Ba);
[magnesium carbonate hydroxide (MgCO$_3$)$_4$'Mg(OH)$_2$];
M(CO$_3$)$_2$ (M=Zn, Cd);
MCO$_3$ (M=Pb);
acetates;
M(CH$_3$CO$_2$)$_2$ (M=Mg, Ca, Sr, Ba, Zn, Cd, Hg);
M(CH$_3$C)$_3$ (M=B, Al, Ga, In);
β-diketonates or derivatives thereof, such as acetylacetonate (2,4-pentanedionate);
[CH$_3$COOCH=C(O—)CH$_3$]$_2$ (M=Mg, Ca, Sr, Ba, Zn, Cd, Hg);
[CH$_3$COOCH=C(O—)CH$_3$]$_2$ (M=B, Al, Ga, In)
oxalates such as SrC$_2$O$_4$, CaC$_2$O$_4$, BaC$_2$O$_4$, or SnC$_2$O$_4$;

inorganic salts such as oxides or nitrates, such as:
SrO;
ZnO;
CdO;
In$_2$O$_3$;
Ga$_2$O$_3$;
SnO$_2$;
PbO$_2$;
Mg(NO$_3$)$_2$;
Ca(NO$_3$)$_2$;
Sr(NO$_3$)$_2$;
Ba(NO$_3$)$_2$;
Cd(NO$_3$)$_2$;
Zn(NO$_3$)$_2$;
Hg(NO$_3$)$_2$;
Al(NO$_3$)$_3$;
In(NO$_3$)$_3$;
Ga(NO$_3$)$_3$;
Sn(NO$_3$)$_4$;
Pb(NO$_3$)$_2$;
or an elemental source of Mg, Ca, Sr, Ba, Zn, Cd, Hg, B, Al, Ga, In, Sn, or Pb.

Examples of precursor sources for an element E for a II-VI, III-V, III-VI or IV-V shell include but are not limited to:

organometallics, in which R=Me, Et, $^t$Bu, $^i$Bu, Pr$^i$, Ph, or similar groups, such as:
NR$_3$, PR$_3$, AsR$_3$, SbR$_3$;
NHR$_2$, PHR$_2$, AsHR$_2$, SbHR$_2$;
NH$_2$R, PH$_2$R, AsH$_2$R, SbH$_2$R$_3$;
PH$_3$, AsH$_3$;
M(NMe)$_3$ (M=P, Sb, As);
dimethyldrazine (Me$_2$NNH$_2$);
ethylazide (Et-NNN);
hydrazine (H$_2$NNH$_2$);
Me$_3$SiN$_3$;
MR$_2$ (M=S, Se Te; R=Me, Et, $^t$Bu, $^i$Bu, or similar group);
HMR (M=S, Se Te; R=Me, Et, $^t$Bu, $^i$Bu, $^i$Pr, Ph, or similar group);
thiourea S=C(NH$_2$)$_2$;
Se=C(NH$_2$)$_2$;
Sn(CH$_4$)$_4$;
Sn(C$_4$H$_9$);
Sn(CH$_3$)$_2$(OOCH$_3$)$_2$;
coordination compounds such as carbonates:
MCO$_3$ (M=P);
bismuth subcarbonate (BiO)$_2$CO$_3$;
M(CO$_3$)$_2$;
acetate M(CH$_3$CO)$_2$ (M=S, Se, Te);
M(CH$_3$C)$_3$ (M=Sn, Pb);
β-diketonates or derivatives thereof, such as acetylacetonate (2,4-pentanedionate);
[CH$_3$COOCH=C(O—)CH$_3$]$_3$M (M=Bi);
[CH$_3$COOCH=C(O—)CH$_3$]$_2$M (M=S, Se, Te);
[CH$_3$COOCH=C(O—)CH$_3$]$_2$M (M=Sn, Pb);
thiourea;
selenourea (H$_2$NC(=Se)NH$_2$);
inorganic salts such as oxides or nitrates:
P$_2$O$_3$;
As$_2$O$_3$;
Sb$_2$O$_3$;
Sb$_2$O$_4$;
Sb$_2$O$_5$;
Bi$_2$O$_3$;
SO$_2$;
SeO$_2$;
TeO$_2$;
Sn$_2$O;
PbO;
PbO$_2$;
Bi(NO$_3$)$_3$;
Sn(NO$_3$)$_4$;
Pb(NO$_3$)$_2$;
or an elemental source of Sn, Ge, N, P, As, Sb, Bi, S, Se, Te, Sn, or Pb.

Examples of single-source precursors for elements M and E for a II-VI shell (i.e., M is a group II element and E is a group VI element) include but are not limited to:
bis(dialkyldithio-carbamato)M, (II) complexes or related Se and Te compounds of the formula M(S$_2$CNR$_2$)$_2$ (M=Zn, Cd, Hg; S=S, Se, O, Te; R=alkyl or ary groups;
Cd[SSiMe$_3$]$_2$;
Cd(SCNHNH$_2$)$_2$Cl$_2$;
Cd(SOCR)$_2$.py;
[Cd(SePh)$_2$]$_2$.

Examples of single-source precursors for elements M and E for a III-V shell (i.e., M is a group III element and E is a group V element) include but are not limited to:
[(Me)$_2$GaN(H)$^t$Bu]$_2$;
[H$_2$GaNH$_2$]$_3$;
[Ph$_2$GaP(SiMe$_3$)$_3$Ga(Ph)$_2$Cl][Et$_2$GaP(SiMe$_3$)$_2$]$_2$;
[Et$_2$GaPEt$_2$]$_3$;
[$^t$Bu$_2$GaPH$_2$]$_3$;
[Me$_2$GaP($^i$Pr)$_2$]$_3$;
[$^t$BuGaPAr']$_2$;
[$^t$Bu$_2$GaP(H)C$_5$H$_9$]$_2$;
Ga(As$^t$Bu$_2$)$_3$;
[Et$_2$GaAs(SiMe$_3$)$_2$]$_2$;
[$^t$Bu$_2$GaAs(SiMe$_3$)$_2$]$_2$;
[Et$_2$GaSb(SiMe$_3$)$_2$]$_2$;
[(Me$_3$SiCH$_2$)$_2$InP(SiMe$_3$)$_2$]$_2$;
[R$_2$InP(SiMe$_3$)$_2$]$_2$;
[Me$_2$InP$^t$Bu$_2$]$_2$;
[Me$_2$InSb$^t$Bu$_2$]$_3$;
[Et$_2$InSb(SiMe$_3$)$_2$]$_3$;
[Me$_2$InNEt$_2$]$_2$;
[Et$_2$AlAs$^t$Bu$_2$]$_2$;
[$^t$Bu$_2$AlSb(SiMe$_3$)$_2$]$_2$;
[$^n$Bu$_2$GaAs$^t$Bu$_2$]$_2$;
[Me$_2$Ga$_2$As$^t$Bu$_2$]$_2$;
[Et$_2$GaAs$^t$Bu$_2$]$_2$.

Examples of single-source precursors for elements M and E for a II-V shell (i.e., M is a group II element and E is a group V element) include but are not limited to:
[MeCdP$^t$Bu$_2$]$_3$
Cd[P(SiPh$_3$)$_2$]$_2$;
Zn[P(SiPh$_3$)$_2$]$_2$.

Examples of single-source precursors for elements M and E for a IV-VI shell (i.e., M is a group IV element and E is a group VI element) include but are not limited to:
lead (II) dithiocarbamates;
lead (II) selenocarbamates.

EXAMPLES

All syntheses and manipulations were carried out under a dry oxygen-free argon or nitrogen atmosphere using standard Schlenk and glove box techniques. All solvents were analytical grade and distilled from appropriate drying agents prior to use (Na/K-benzophenone for THF, Et$_2$O, toluene, hexanes, pentane; magnesium for methanol and ethanol and calcium hydride for acetone). All chemicals were analytical grade.

Elemental analyses were performed on a CARLO ERBA CHNS-O EA1108 Elemental Analyzer. UV-vis absorption spectra were measured on a Thermospectronic Heλios β

Spectrophotometer. PL spectra were measured with a Fluorolog-3 (FL3-22) photospectrometer with an excitation wavelength of 380 nm. Spectra were obtained with the slits set at 2 nm and an integration time of 1 second, or measured in situ using an Ocean Optics 2000 USB probe. Powder X-Ray diffraction (PXRD) measurements were performed on a Bruker AXS D8 diffractometer using monochromatic Cu—K$_\alpha$ radiation with the samples mounted flat and scanned from 10° to 70° with step sizes of 0.04° and a count rate of 2.5 seconds. PXRD measurements were taken using a glancing angle incidence detector at an angle of 3° for 2θ values of 20°-60° in steps of 0.04° and a count time of 1 second. A Philips CM200 transmission electron microscope (TEM) was used to observe the morphology and size distribution of nanoparticles and for energy dispersive analysis of X-ray fluorescence (EDAX). The samples for TEM and EDAX were prepared by placing a drop of a dilute suspension of a sample in toluene on a copper grid (300 meshes, available from Agar Scientific). The excess solvent was allowed to dry at room temperature.

Preparation of [HNEt$_3$]$_2$[Cd$_4$(SPh)$_{10}$]

To a stirred methanol (60 ml) solution of benzenethiol (20.00 g, 182 mmol) and triethylamine (18.50 g, 182 mmol) was added dropwise Cd(NO$_3$)$_2$.4H$_2$O (21.00 g, 68.00 mmol) that had previously been dissolved in methanol (60 mL). The solution was then allowed to stir while warming until the precipitate had completely dissolved to leave a clear solution. This was then placed at 5° C. for 24 hours, during which large colorless crystals of [HNEt$_3$]$_2$[Cd$_4$(SPh)$_{10}$] formed.

Preparation of [HNEt$_3$]$_4$[Cd$_{10}$Se$_4$(SPh)$_{16}$]

To a stirred acetonitrile (100 ml) solution of [HNEt$_3$]$_2$[Cd$_4$(SPh)$_{10}$] (80.00 g, 45.58 mmol) was added selenium powder (3.57 g, 45.21 mmol), and the resulting slurry was left to stir for 12 hours, producing a white precipitate. A further 750 ml of acetonitrile was added and the solution warmed to 75° C. to give a clear pale yellow solution. The solution was allowed to cool to 5° C., yielding large colorless crystals. The crystals were washed in hexane and recrystallized from hot acetonitrile, resulting in 22.50 g of [HNEt$_3$]$_4$[Cd$_{10}$Se$_4$(SPh)$_{16}$].

Preparation of CdSe Nanoparticles from [Et$_3$NH]$_4$[Cd$_{10}$Se$_4$(SPh)$_{16}$]/TOPSe/Cd(CH$_3$CO$_2$)$_2$ in HDA HDA (300 g) was placed in a three-neck flask and dried/degassed by heating to 120° C. under a dynamic vacuum for 1 hour. The solution was then cooled to 70° C. To this was added 1.0 g of [Et$_3$NH]$_4$[Cd$_{10}$Se$_4$(SPh)$_{16}$] (0.311 mmol), TOPSe (20 ml, 40.00 mmol) [previously prepared from dissolving selenium powder in TOP] and Cd(CH$_3$CO$_2$)$_2$ (10.66 g, 40.00 mmol), and the temperature of reaction mixture was gradually increased from 70° C. to 180° C. over an 8 hour period. The progressive formation and growth of the nanoparticles was monitored by their emission wavelength by taking aliquots from the reaction mixture and measuring the UV-vis and PL spectra thereof. The reaction was stopped when the emission spectra corresponded to the desired size (572 nm) by cooling the reaction to 60° C., followed by addition of 200 ml of dry "warm" ethanol, resulting in pre-cipitation of nanoparticles. The resulting CdSe nanoparticles were dried before re-dissolving in toluene filtering through Celite, followed by re-precipitation from warm ethanol to remove any excess HDA and Cd(CH$_3$CO$_2$)$_2$. This produced 9.26 g of HDA-capped CdSe nanoparticles.

Preparation of CdSe Nanoparticles from [Et$_3$NH]$_4$[Cd$_{10}$Se$_4$(SPh)$_{16}$]/TOPSe/Cd(CH$_3$CO$_2$)$_2$ in HDA HDA (250 g) and octylamine (20 g) were placed in a three-neck flask and dried/degassed by heating to 120° C. under a dynamic vacuum for 1 hour. The solution was then cooled to 70° C. To this was added 1.0 g of [Et$_3$NH]$_4$[Cd$_{10}$Se$_4$(SPh)$_{16}$] (0.311 mmol), TOPSe (1 M, 4 ml, 4.00 mmol) [previously prepared from dissolving selenium powder in TOP], and Cd(CH$_3$CO$_2$)$_2$ dissolved in TOP (0.5 M, 4 ml, 2.00 mmol). The temperature of reaction mixture was gradually increased from 70° C. to 150° C. over a 1 hour period. A further 17 ml (17.00 mmol) of TOPSe and 27 ml of 0.5 M Cd(CH$_3$CO$_2$)$_2$ dissolved in TOP (13.50 mmol) were added drop-wise while the temperature was gradually increased to 200° C. over a 24 hour period. The progressive formation and growth of the nanoparticles was monitored via emission wavelength by taking aliquots from the reaction mixture and measuring the UV-vis and PL spectra. The reaction was stopped when the emission spectra corresponded to the desired size (630 nm) by cooling the reaction to 60° C. followed by addition of 200 ml of dry "warm" ethanol, resulting in a precipitation of particles. The resulting CdSe nanoparticles were dried before re-dissolving in toluene filtering through Celite, followed by re-precipitation from warm ethanol to remove any excess HDA. This produced 4.56 g of HDA-capped CdSe nanoparticles.

Preparation of CdSe Nanoparticles from [Et$_3$NH]$_4$[Cd$_{10}$Se$_4$(SPh)$_{16}$]/TOP/Se/CdO in HDA HDA (150 g) and t-decylphosphonic acid (0.75 g) were placed in a three-neck flask and dried and degassed by heating to 120° C. under a dynamic vacuum for 1 hour. The solution was then cooled to 80° C. To this was added 0.5 g of [Et$_3$NH]$_4$[Cd$_{10}$Se$_4$(SPh)$_{16}$] (0.156 mmol), 20 ml of TOP, 0.6 g of selenium powder (7.599 mmol) and 0.8 g CdO (6.231 mmol). The reaction mixture was stirred, resulting in a pale red, cloudy mixture. The temperature of the reaction mixture was gradually increased from 80° C. to 250° C. over a period of 24 hours. The progressive formation and growth of the nanoparticles was followed via emission wavelength by taking aliquots from the reaction mixture and measuring the UV-vis and PL spectra. The reaction was stopped when the emission spectra corresponded to the desired size (593 nm) by cooling the reaction to 60° C. followed by addition of 200 ml of dry "warm" ethanol, resulting in a precipitation of particles. The resulting CdSe nanoparticles were dried before re-dissolving in toluene filtering through Celite, followed by re-precipitation from warm ethanol to remove any excess HDA. This produced 1.55 g of HDA-capped CdSe nanoparticles.

Preparation of CdSe Nanoparticles from [Et$_3$NH]$_4$[Cd$_{10}$Se$_4$(SPh)$_{16}$]/TOPSe/Cd(HO)$_2$ in HDA HDA (400 g) was placed in a three-neck flask and dried and degassed by heating to 120° C. under a dynamic vacuum for 1 hour. The solution was then cooled to 70° C. To this was added 1.00 g of [Et$_3$NH]$_4$[Cd$_{10}$Se$_4$(SPh)$_{16}$] (0.278 mmol), 20.0 ml of TOPSe, (2 M solution) and 5.85 g of Cd(OH)$_2$ (40.00 mmol). The reaction mixture was stirred, resulting in a pale yellow, cloudy mixture. The temperature of the reaction mixture was gradually increased from 70° C. to 240° C. over a period of 24 hours. The progressive formation and growth of the nanoparticles was followed via emission wavelength by taking aliquots from the reaction mixture and measuring the UV-vis and PL spectra. The reaction was stopped when the emission spectra corresponded to the desired size (609 nm) by cooling the reaction to 60° C. followed by addition of 200 ml of dry "warm" ethanol, resulting in a precipitation of particles. The resulting CdSe nanoparticles were dried before re-dissolving in toluene filtering through Celite, followed by re-precipitation from warm ethanol to remove any excess HDA. This produced 10.18 g of HDA-capped CdSe nanoparticles.

Preparation of CdSe Nanoparticles from $[Et_3NH]_4[Cd_{10}Se_4(SPh)_{16}]$/TOPSe/Me$_2$Cd in HDA HDA (100 g) was placed in a three-neck flask and dried and degassed by heating to 120° C. under a dynamic vacuum for 1 hour. The solution was then cooled to 70° C. To this was added 0.13 g of $[Et_3NH]_4[Cd_{10}Se_4(SPh)_{16}]$ (0.036 mmol), 2.5 ml of TOPSe, (2 M solution) and 0.71 g Me$_2$Cd [that had previously been dissolved in TOP] (0.358 ml, 5.00 mmol), and the reaction mixture was stirred. The temperature of the reaction mixture was gradually increased from 80° C. to 260° C. over a period of 24 hours. The progressive formation and growth of the nanoparticles was followed via emission wavelength by taking aliquots from the reaction mixture and measuring the UV-vis and PL spectra. The reaction was stopped when the emission spectra corresponded to the desired size (587 nm) by cooling the reaction to 60° C. followed by addition of 100 ml of dry "warm" ethanol, resulting in a precipitation of particles. The resulting CdSe nanoparticles were dried before re-dissolving in toluene filtering through Celite, followed by re-precipitation from warm ethanol to remove any excess HDA. This produced 1.52 g of HDA-capped CdSe nanoparticles.

Preparation of CdSe Nanoparticles from $[Et_3NH]_4[Cd_{10}Se_4(SPh)_{16}]$/TOPSe/Me$_2$Cd in HDA HDA (100 g) was placed in a three-neck flask and dried and degassed by heating to 120° C. under a dynamic vacuum for 1 hour. The solution was then cooled to 70° C. To this was added 0.13 g of $[Et_3NH]_4[Cd_{10}Se_4(SPh)_{16}]$ (0.036 mmol). The temperature was then increased to 100° C. and maintained at this temperature while 2.5 ml of TOPSe, (2 M solution) and 0.71 g Me$_2$Cd [that had previously been dissolved in TOP] (0.358 ml, 5.00 mmol) were added drop-wise over a four-hour period. The progressive formation and growth of the nanoparticles was followed via emission wavelength by taking aliquots from the reaction mixture and measuring the UV-Vis and PL spectra. The reaction was stopped when the emission spectra corresponded to the desired size (500 nm) by cooling the reaction to 60° C. followed by addition of 100 ml of dry "warm" ethanol, resulting in a precipitation of particles. The resulting CdSe nanoparticles were dried before re-dissolving in toluene filtering through Celite, followed by re-precipitation from warm ethanol to remove any excess HDA. This produced 1.26 g of HDA-capped CdSe nanoparticles.

Preparation of CdSe Nanoparticles from $[Et_3NH]_4[Cd_{10}Se_4(SPh)_{16}]$/TOPSe/$(C_{17}H_{35}COO)_2$Cd in HDA HDA (200 g) was placed in a three-neck flask and dried and degassed by heating to 120° C. under a dynamic vacuum for 1 hour. The solution was then cooled to 80° C. To this was added 0.5 g of $[Et_3NH]_4[Cd_{10}Se_4(SPh)_{16}]$ (0.139 mmol), 20 ml of TOPSe (2 M solution) and a solution of 2.568 g CdO (20 mmol) previously dissolved in steric acid (23.00 g). The reaction mixture was stirred, resulting in a pale yellow, clear solution. The temperature of the reaction mixture was gradually increased from 70° C. to 220° C. over a period of 24 hours. The progressive formation and growth of the nanoparticles was followed via emission wavelength by taking aliquots from the reaction mixture and measuring the UV-vis and PL spectra. The reaction was stopped when the emission spectra corresponded to the desired size (590 nm) by cooling the reaction to 60° C. followed by addition of 400 ml of dry "warm" ethanol, resulting in a precipitation of nanoparticles. The resulting CdSe nanoparticles were dried before re-dissolving in toluene filtering through Celite, followed by re-precipitation from warm ethanol to remove any excess HDA. This produced 4.27 g of HDA-capped CdSe nanoparticles.

Preparation of CdSe Nanoparticles from $[Et_3NH]_4[Cd_{10}Se_4(SPh)_{16}]$/TOPSe/CdCO$_3$ in HDA HDA (50 g) was placed in a three-neck flask and dried/degassed by heating to 120° C. under a dynamic vacuum for 1 hour. The solution was then cooled to 75° C. To this was added 0.5 g of $[Et_3NH]_4[Cd_{10}Se_4(SPh)_{16}]$ (0.156 mmol), TOPSe (1.0 M, 5 ml, 5.00 mmol) [previously prepared from dissolving selenium powder in TOP] and CdCO$_3$ dissolved in TOP (0.5 M, 5 ml, 2.50 mmol), and the temperature of reaction mixture was gradually increased from 70° C. to 200° C. over a 48 hour period. The progressive formation and growth of the nanoparticles was monitored via emission wavelength by taking aliquots from the reaction mixture and measuring the UV-vis and PL spectra. The reaction was stopped when the emission spectra corresponded to the desired size (587 nm) by cooling the reaction to 60° C., followed by addition of 200 ml of dry "warm" ethanol, resulting in a precipitation of particles. The resulting CdSe nanoparticles were dried before re-dissolving in toluene filtering through Celite, followed by re-precipitation from warm ethanol to remove any excess HDA. This produced 0.95 g of HDA-capped CdSe nanoparticles.

Preparation of CdTe Nanoparticles from $[Et_3NH]_4[Cd_{10}Se_4(SPh)_{16}]$/TOPTe/Cd(CH$_3$CO$_2$)$_2$ in HDA HDA (200 g) was placed in a three-neck flask and dried/degassed by heating to 120° C. under a dynamic vacuum for 1 hour. The solution was then cooled to 70° C. To this was added 1.0 g of $[Et_3NH]_4[Cd_{10}Se_4(SPh)_{16}]$ (0.311 mmol), a brown slurry of TOP (20 ml) with tellurium (2.55 g, 20.00 mmol), and Cd(CH$_3$CO$_2$)$_2$ (4.33 g, 20.00 mmol). The temperature of reaction mixture was gradually increased from 70° C. to 160° C. over an 8 hour period. The progressive formation and growth of the CdTe nanoparticles was monitored via emission wavelengths by taking aliquots from the reaction mixture and measuring the UV-vis and PL spectra. The reaction was stopped when the emission spectra corresponded to the desired size (624 nm) by cooling the reaction to 60° C. followed by addition of 200 ml of dry "warm" ethanol, resulting in a precipitation of nanoparticles. The resulting CdTe nanoparticles were dried before recrystallizing from toluene followed by re-precipitation from warm ethanol to remove any excess HDA. This produced 6.92 g of HDA-capped CdTe nanoparticles.

Preparation of III-V Nanoparticles

General procedure: A cluster such as $[HNEt_3]_4[Zn_{10}S_4(SPh)_{16}]$, and small quantities of feedstock precursors, i.e., a group III element precursor such as In(myristate)$_3$ and a group V element precursor such as P(TMS)$_3$ are added to a solution containing a capping agent. The temperature is then increased (e.g., to between approximately 80° C. and approximately 140° C.) and the reaction stirred for a period of time (e.g., approximately 10 minutes to approximately 24 hours), resulting in the onset of III-V nanoparticle formation. Further dropwise addition of both of the feedstock precursors may lead to a red shift of the PL emission maximum of the quantum dots, as monitored by an in situ PL probe. If further precursor is added at this stage there may be no further red shift of the PL maximum, thus signifying the conclusion of nanoparticle growth. However, when the temperature is increased (by, e.g., 5-40° C.), the PL maximum again may red shift. When more precursors are added to the warmed reaction solution, the PL maximum red may shift again. Therefore, this cycle of addition of precursor followed by incrementally increasing the reaction temperature may be repeated until the PL maximum peak is at the desired emission (also signifying the desired nanoparticle size). The reaction may then be cooled to a lower temperature (e.g., approximately 20° C. to approximately 60° C. below the final reaction temperature) and allowed to anneal for a further period of time (e.g., approximately 30 minutes to approximately 7 days). Organic-capped III-V nanoparticles may then be isolated from the reaction mixture.

Choice of molecular cluster: A II-VI molecular cluster may preferably be used instead of a III-V one, as there are few known III-V molecular clusters. Additionally, III-V molecular clusters are difficult to make and are generally sensitive to air and moisture. In contrast, many II-VI molecular clusters are generally not sensitive to air or moisture and may be made by simple procedures. III-V particles may be seeded on a number of II-VI molecular clusters, depending on the III-V material being grown and the feedstock precursors employed.

Preparation of InP nanoparticles (red emission): 200 milliliters (ml) of di-n-butylsebacate ester and 10 grams of myristic acid at approximately 60° C. were placed in a round-bottomed three-neck flask and purged with $N_2$. Next, 0.94 grams of the ZnS cluster $[HNEt_3]_4[Zn_{10}S_4(SPh)_{16}]$ were added to the flask. The flask was then heated to approximately 100° C. for 30 minutes. Next, 12 ml of 0.25M $[In_2(Ac)_3(MA)_3]$ (where Ac refers to acetate and MA refers to myristate) was added over a period of 15 minutes using an electronic syringe pump at a rate of 48 ml per hour, followed by the addition of 12 ml 0.25M $(TMS)_3P$ at the same rate. Once these additions were complete, the temperature of the flask was increased to 180° C. To grow the particles up to the required size (leading to the desired red emission), further addition of $[In_2(Ac)_3(MA)_3]$ and $(TMS)_3P$ were made as follows:

16 ml $[In_2(Ac)_3(MA)_3]$ and 16 ml $(TMS)_3P$ were added followed by a temperature increase to 200° C.;

further additions of 10 ml of $[In_2(Ac)_3(MA)_3]$ were made and the temperature was maintained at approximately 200° C. for 1 hour;

the temperature was then lowered to approximately 160° C. and the reaction allowed to anneal at this temperature for approximately 3 days.

Finally, the particles were isolated using acetonitrile, precipitated from the reaction solution, centrifuged, and collected.

Preparation of InP quantum dots with emission in the range of 500-700 nm: Di-butyl ester (approximately 100 ml) and myristic acid (approximately 10.06 grams) were placed in a three-neck flask and degassed at approximately 70° C. under vacuum for 1 hour. After this period, nitrogen was introduced and the temperature increased to approximately 90° C. Approximately 4.71 grams of the ZnS molecular cluster $[Et_3NH_4][Zn_{10}S_4(SPh)_{16}]$ was added, and the mixture was stirred for approximately 45 minutes. The temperature was then increased to approximately 100° C., followed by the drop-wise additions of $In(MA)_3$ (1M, 15 ml) followed by $(TMS)_3P$ (1M, 15 ml). The reaction mixture was stirred while the temperature was increased to approximately 140° C. At 140° C., further drop-wise additions of $In(MA)_3$ dissolved in di-n-butylsebacate ester (1M, 35 ml) (left to stir for 5 minutes) and $(TMS)_3P$ dissolved in di-n-butylsebacate ester (1M, 35 ml) were made. The temperature was then slowly increased to 180° C. and further drop-wise additions of $In(MA)_3$ (1M, 55 ml) followed by $(TMS)_3P$ (1M, 40 ml) were made. By addition of the precursor in this manner, particles of InP with an emission maximum gradually increasing from 500 nanometers (nm) to 720 nm were formed. The reaction was stopped when the desired emission maximum was obtained and left to stir at the reaction temperature for half an hour. After this period, the temperature was decreased to 160° C. and the reaction mixture was left to anneal for up to approximately 4 days (at a temperature approximately 20-40° C. below that of the reaction). A UV lamp was also used at this stage to aid in annealing.

The particles were isolated by the addition of dried degassed methanol (approximately 200 ml) via cannula techniques. The precipitate was allowed to settle and then methanol was removed via cannula with the aid of a filter stick. Dried degassed chloroform (approximately 10 ml) was added to wash the solid. The solid was left to dry under vacuum for 1 day. This procedure resulted in the formation of InP nanoparticles on ZnS molecular clusters.

Postoperative treatments: The quantum yields of the resulting InP nanoparticles were further increased by washing in dilute hydrofluoric acid (HF). The nanoparticles were dissolved in anhydrous degassed chloroform (~270 ml). A 50 ml portion was removed, placed in a plastic flask, and flushed with nitrogen. Using a plastic syringe, the HF solution was prepared by adding 3 ml of 60% w/w HF in water and adding degassed THF (17 ml). The HF was added drop-wise over approximately 5 hours to the InP dots. After addition of the HF, the solution was left to stir overnight. Excess HF was removed by extraction through calcium chloride solution (in water) and drying the etched InP dots. The dried dots were re-dispersed in 50 ml chloroform for future use. The emission maximum was approximately 567 nm, and the particles had a full width half maximum value (FWHM) of approximately 60 nm. The quantum efficiencies of the InP core material ranged from approximately 25% to approximately 50%.

Growth of a ZnS shell: A 20 ml portion of the HF-etched InP core particles was dried in a three-neck flask. 1.3 grams of myristic acid and 20 ml di-n-butyl sebacate ester were added and degassed for 30 minutes. The solution was heated to 200° C., and 2 ml of 1M $(TMS)_2S$ was added drop-wise (at a rate of 7.93 ml/hr). After this addition was complete, the solution was left to stand for 2 minutes, and then 1.2 grams of anhydrous zinc acetate was added. The solution was kept at 200° C. for 1 hour and then cooled to room temperature. The particles were isolated by adding 40 ml of anhydrous degassed methanol and centrifuging. The supernatant liquid was discarded, and 30 ml of anhydrous degassed hexane was added to the remaining solid. The solution was allowed to settle for 5 hours and then centrifuged again. The supernatant liquid was collected and the remaining solid was discarded. The emission maximum was approximately 535 nm, and the particles had a FWHM of approximately 50-65 nm. The quantum efficiencies of the InP core material ranged from approximately 35% to approximately 90%.

It will be seen that the techniques described herein provide a basis for improved production of nanoparticle materials. The terms and expressions employed herein are used as terms of description and not of limitation, and there is no intention in the use of such terms and expressions of excluding any equivalents of the features shown and described or portions thereof. Instead, it is recognized that various modifications are possible within the scope of the invention claimed.

What is claimed is:

1. A nanoparticle comprising:
   (i) a molecular cluster compound incorporating ions from groups 12 and 16 of the periodic table, and
   (ii) a core semiconductor material provided on said molecular cluster compound,
   wherein the core semiconductor material incorporates ions from groups 13 and 15 of the periodic table.

2. The nanoparticle of claim 1 wherein a crystal phase of the molecular cluster compound and a crystal phase of the core semiconductor material are compatible.

3. The nanoparticle of claim 1 wherein the molecular cluster compound incorporates zinc ions.

4. The nanoparticle of claim 1 wherein the group 16 ions comprise at least one member of the group consisting of oxide ions, sulfide ions, selenide ions, and telluride ions.

5. The nanoparticle of claim 1 wherein the group 13 ions comprise at least one member of the group consisting of aluminum ions, gallium ions, and indium ions.

6. The nanoparticle of claim 1 wherein the group 15 ions comprise at least one member of the group consisting of nitride ions, arsenide ions, and antimonide ions.

7. The nanoparticle of claim 1 wherein the nanoparticle exhibits a quantum efficiency ranging from about 20% to about 60%.

8. The nanoparticle of claim 1 further comprising a first layer comprising a first semiconductor material provided on said nanoparticle core.

9. The nanoparticle of claim 8 wherein said first semiconductor material incorporates ions from group 12 of the periodic table.

10. The nanoparticle of claim 8 wherein said first semiconductor material incorporates ions from group 16 of the periodic table.

11. The nanoparticle of claim 9 wherein the group 12 ions comprise zinc ions.

12. The nanoparticle of claim 9 wherein the group 16 ions comprise at least one member of the group consisting of oxide ions, sulfide ions, selenide ions and telluride ions.

13. The nanoparticle of claim 8 further comprising a second layer comprising a second semiconductor material provided on said first layer.

14. A method of producing nanoparticles, the method comprising the steps of:
providing a nanoparticle precursor composition comprising group 13 ions and group 15 ions; and
effecting conversion of the nanoparticle precursor into nanoparticles,
wherein said conversion is effected in the presence of a molecular cluster compound incorporating group 12 ions and group 16 ions under conditions permitting nanoparticle seeding and growth.

* * * * *